US012733331B2

(12) United States Patent
Joei et al.

(10) Patent No.: US 12,733,331 B2
(45) Date of Patent: Sep. 8, 2026

(54) SOLID-STATE IMAGING DEVICE AND METHOD OF MANUFACTURING SOLID-STATE IMAGING DEVICE

(71) Applicants: SONY GROUP CORPORATION, Tokyo (JP); SONY SEMICONDUCTOR SOLUTIONS CORPORATION, Kanagawa (JP)

(72) Inventors: Masahiro Joei, Kanagawa (JP); Kenichi Murata, Kanagawa (JP); Fumihiko Koga, Kanagawa (JP); Iwao Yagi, Kanagawa (JP); Shintarou Hirata, Kanagawa (JP); Hideaki Togashi, Kanagawa (JP); Yosuke Saito, Tokyo (JP); Nobutoshi Fujii, Kanagawa (JP)

(73) Assignees: Sony Group Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 425 days.

(21) Appl. No.: 17/778,227

(22) PCT Filed: Nov. 12, 2020

(86) PCT No.: PCT/JP2020/042266

§ 371 (c)(1),
(2) Date: May 19, 2022

(87) PCT Pub. No.: WO2021/100605

PCT Pub. Date: May 27, 2021

(65) Prior Publication Data

US 2022/0415969 A1 Dec. 29, 2022

(30) Foreign Application Priority Data

Nov. 20, 2019 (JP) ................................ 2019-209438

(51) Int. Cl.
*H10K 39/32* (2026.01)
*H01L 21/02* (2006.01)
(Continued)

(52) U.S. Cl.
CPC ............. *H10K 39/32* (2023.02); *H04N 25/70* (2023.01); *H10F 39/018* (2025.01); *H10F 39/12* (2025.01);
(Continued)

(58) Field of Classification Search
CPC ........ H10K 39/38; H10K 30/88; H10K 30/82; H10K 71/50; H10K 71/80;
(Continued)

(56) References Cited

U.S. PATENT DOCUMENTS

2001/0015256 A1* 8/2001 Yamazaki ............. H10D 86/40 156/289
2005/0205901 A1* 9/2005 Suzuki ............. H01L 27/14647 257/292
(Continued)

FOREIGN PATENT DOCUMENTS

CN 109360835 A 2/2019
CN 109716527 A 5/2019
(Continued)

OTHER PUBLICATIONS

International Search Report from corresponding PCT application PCT/JP2020/042266, dated Jan. 26, 2021.

*Primary Examiner* — Sue A Purvis
*Assistant Examiner* — Aneta B Cieslewicz
(74) *Attorney, Agent, or Firm* — K&L Gates LLP

(57) ABSTRACT

A solid-state imaging device according to an embodiment of the present disclosure includes: a plurality of photoelectric converters that is stacked on a semiconductor substrate, and has wavelength selectivities different from each other; and a
(Continued)

wiring line that is formed on the semiconductor substrate, and is electrically coupled to the plurality of photoelectric converters. Each of the photoelectric converters includes a photoelectric conversion film, and a first electrode and a second electrode that are disposed with the photoelectric conversion film interposed therebetween. The wiring line extends in a direction normal to the semiconductor substrate, and includes a vertical wiring line formed in contact with the second electrode of each of the photoelectric converters.

13 Claims, 25 Drawing Sheets

(51) Int. Cl.

| | |
|---|---|
| ***H01L 21/3205*** | (2006.01) |
| ***H01L 21/768*** | (2006.01) |
| ***H01L 23/522*** | (2006.01) |
| ***H04N 25/70*** | (2023.01) |
| ***H10F 39/00*** | (2025.01) |
| ***H10F 39/12*** | (2025.01) |
| ***H10K 30/30*** | (2023.01) |
| ***H10K 30/82*** | (2023.01) |
| ***H10K 30/88*** | (2023.01) |
| ***H10K 71/50*** | (2023.01) |
| ***H10K 71/80*** | (2023.01) |
| ***H10P 14/40*** | (2026.01) |
| ***H10P 95/00*** | (2026.01) |
| ***H10W 20/00*** | (2026.01) |
| ***H10W 20/40*** | (2026.01) |

(52) U.S. Cl.

CPC ......... *H10F 39/804* (2025.01); *H10F 39/805* (2025.01); *H10F 39/811* (2025.01); *H10K 30/82* (2023.02); *H10K 30/88* (2023.02); *H10K 71/50* (2023.02); *H10K 71/80* (2023.02); *H10P 14/40* (2026.01); *H10P 95/00* (2026.01); *H10W 20/01* (2026.01); *H10W 20/40* (2026.01); *H10K 30/30* (2023.02)

(58) Field of Classification Search

CPC ............. H10K 39/32–34; H10K 30/30; H01L 27/146; H01L 27/14618; H01L 27/1462; H01L 27/14636; H01L 27/1469; H01L 21/768; H01L 21/3205; H01L 21/522; H01L 21/02–32155; H01L 23/522; H04N 25/70–79; H10F 39/12–199; H10F 39/014; H10F 39/018; H10F 39/804; H10F 39/805; H10F 39/811

See application file for complete search history.

(56) References Cited

U.S. PATENT DOCUMENTS

| | | | | |
|---|---|---|---|---|
| 2005/0263839 | A1* | 12/2005 | Suzuki .................. | H10F 39/811 257/E27.135 |
| 2008/0251798 | A1* | 10/2008 | Ogihara ................ | H01L 33/641 257/E33.001 |
| 2011/0019042 | A1 | 1/2011 | Yamaguchi | |
| 2012/0193689 | A1 | 8/2012 | Park | |
| 2015/0187843 | A1 | 7/2015 | Hatano et al. | |
| 2017/0148841 | A1* | 5/2017 | Matsumoto ....... | H01L 27/14636 |
| 2018/0076252 | A1 | 3/2018 | Togashi et al. | |
| 2018/0175102 | A1 | 6/2018 | Togashi et al. | |
| 2018/0190697 | A1 | 7/2018 | Lee | |
| 2019/0319071 | A1 | 10/2019 | Hirose | |
| 2020/0119078 | A1 | 4/2020 | Moriwaki et al. | |
| 2020/0303449 | A1 | 9/2020 | Togashi et al. | |

FOREIGN PATENT DOCUMENTS

| | | | | |
|---|---|---|---|---|
| JP | 2003332551 | A | 11/2003 | |
| JP | 2005051115 | A | 2/2005 | |
| JP | 2011029337 | A | 2/2011 | |
| JP | 2011193110 | A | 9/2011 | |
| JP | 2012114160 | A | 6/2012 | |
| JP | 2013055252 | A | 3/2013 | |
| JP | 2017098513 | A | 6/2017 | |
| JP | 2017157816 | A | 9/2017 | |
| JP | 2019091733 | A | 6/2019 | |
| WO | 2014027588 | A1 | 2/2014 | |
| WO | WO-2018154644 | A1 | 8/2018 | |
| WO | 2018194051 | A1 | 10/2018 | |
| WO | WO-2018180577 | A1 | 10/2018 | |
| WO | WO-2019240121 | A1 * | 12/2019 | ....... H01L 27/14612 |
| WO | WO-2020022462 | A1 * | 1/2020 | ....... H01L 27/14603 |

* cited by examiner

[ FIG. 1 ]
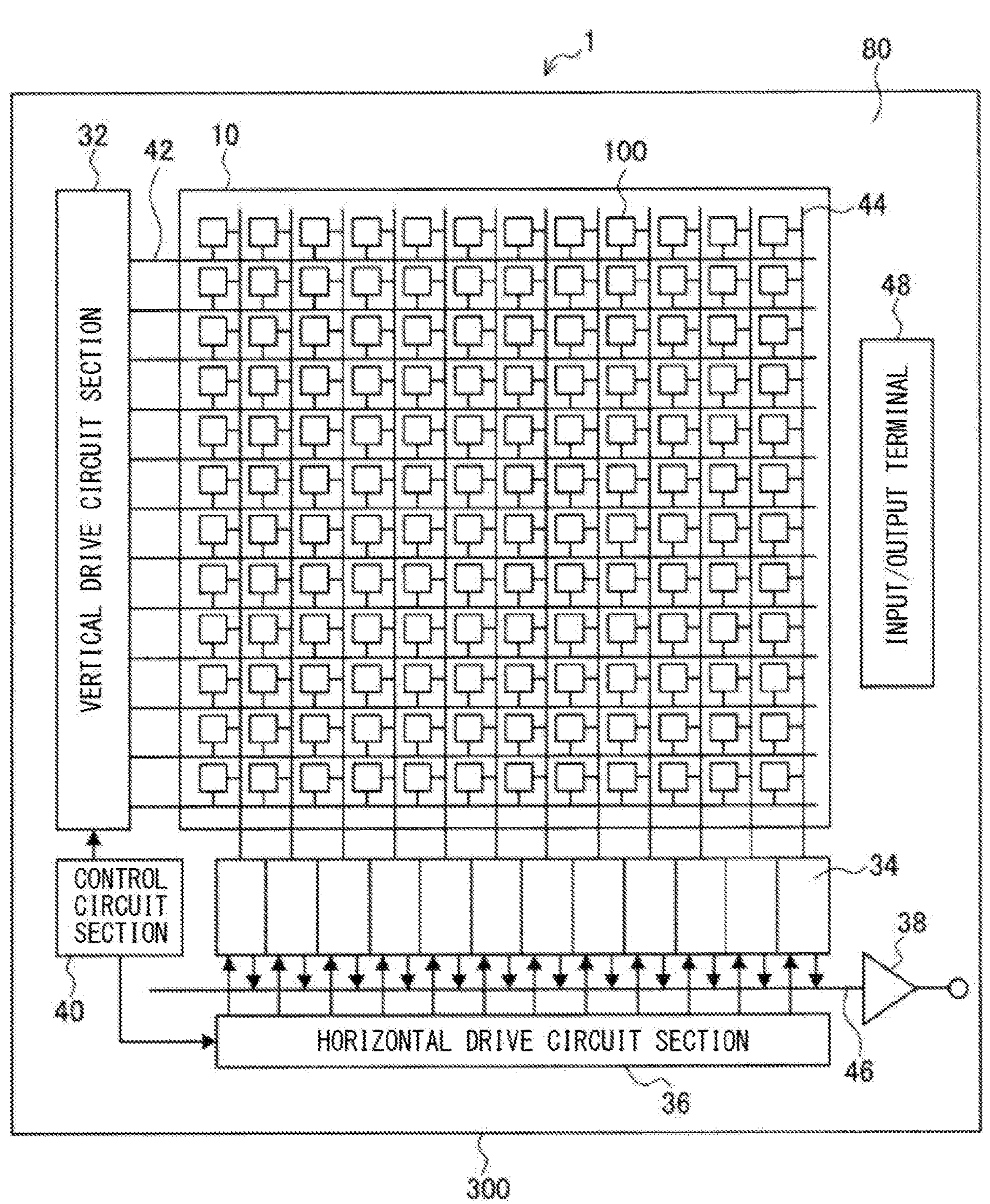

[ FIG. 2 ]
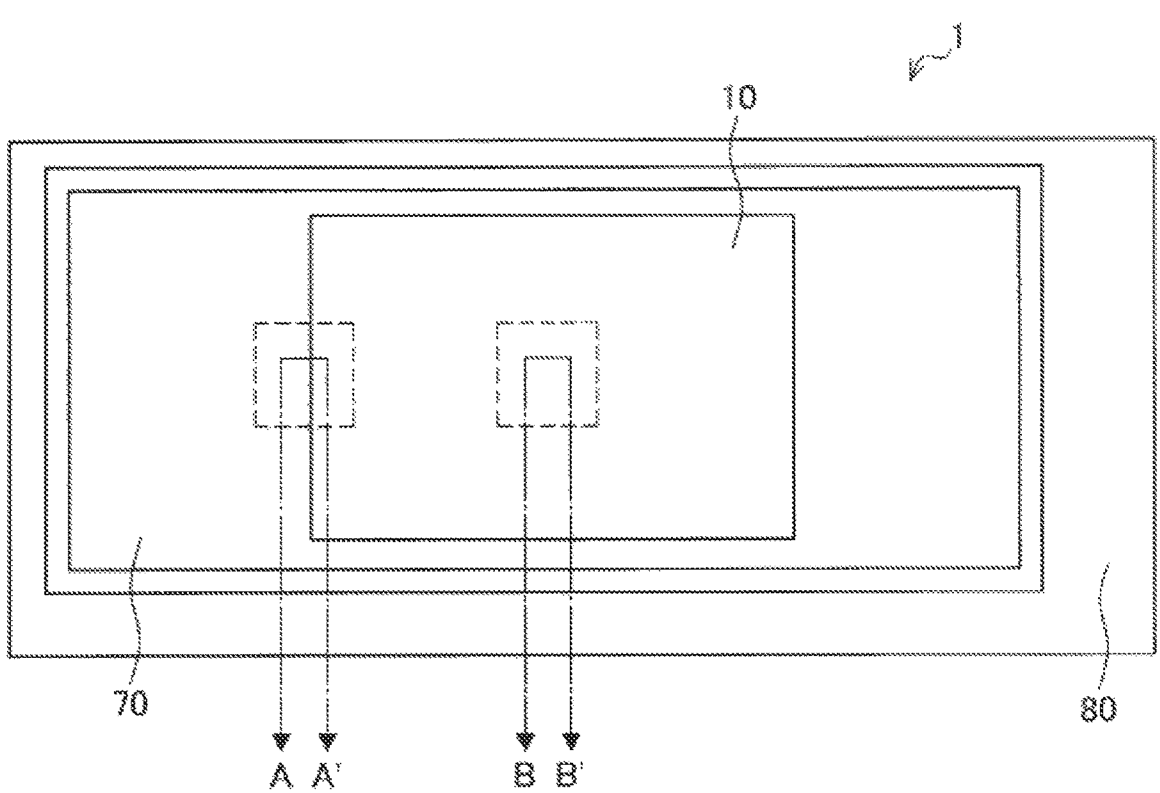

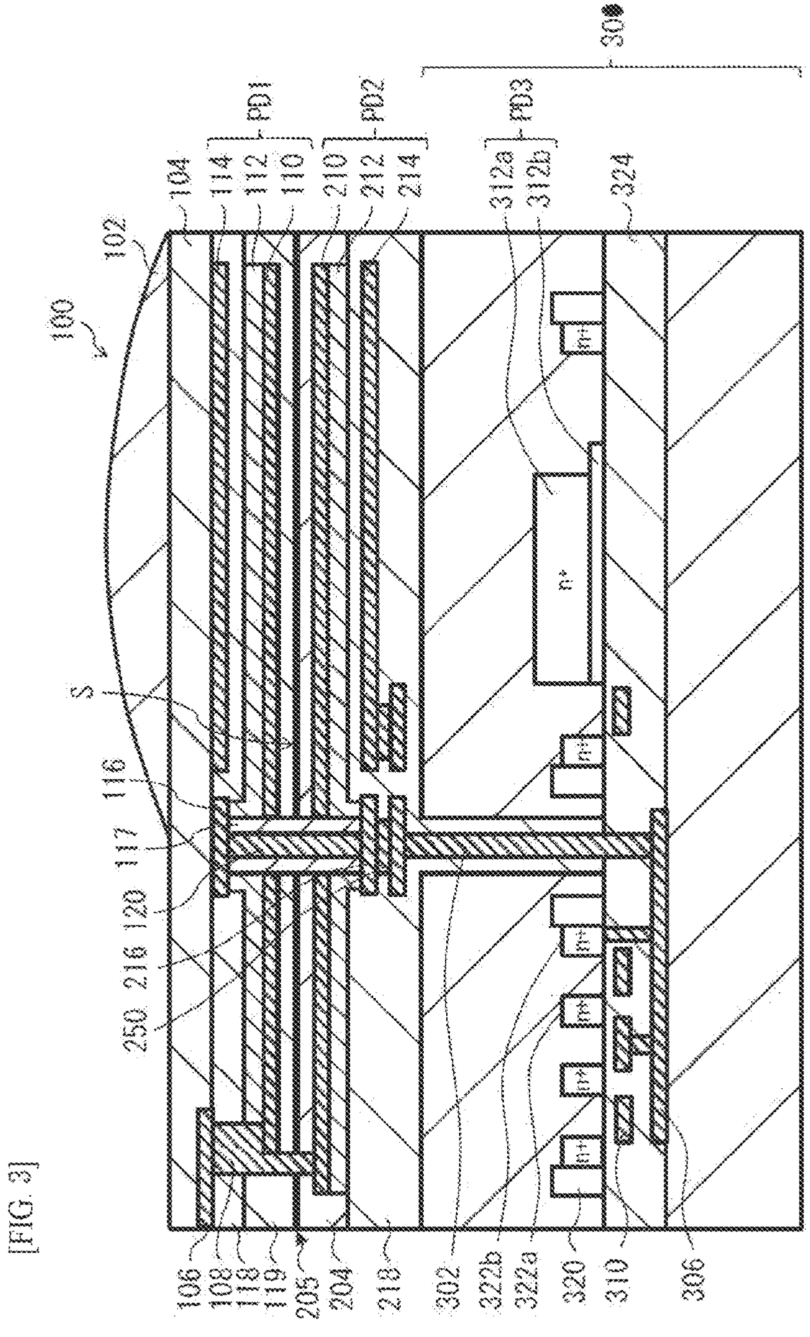
[FIG 3]
100
102
104
114
112
110
210
212
214
PD1
PD2
PD3
312a
312b
300
324
S
116
117
120
216
250
106
108
118
119
205
204
218
302
322b
322a
320
310
306
n+

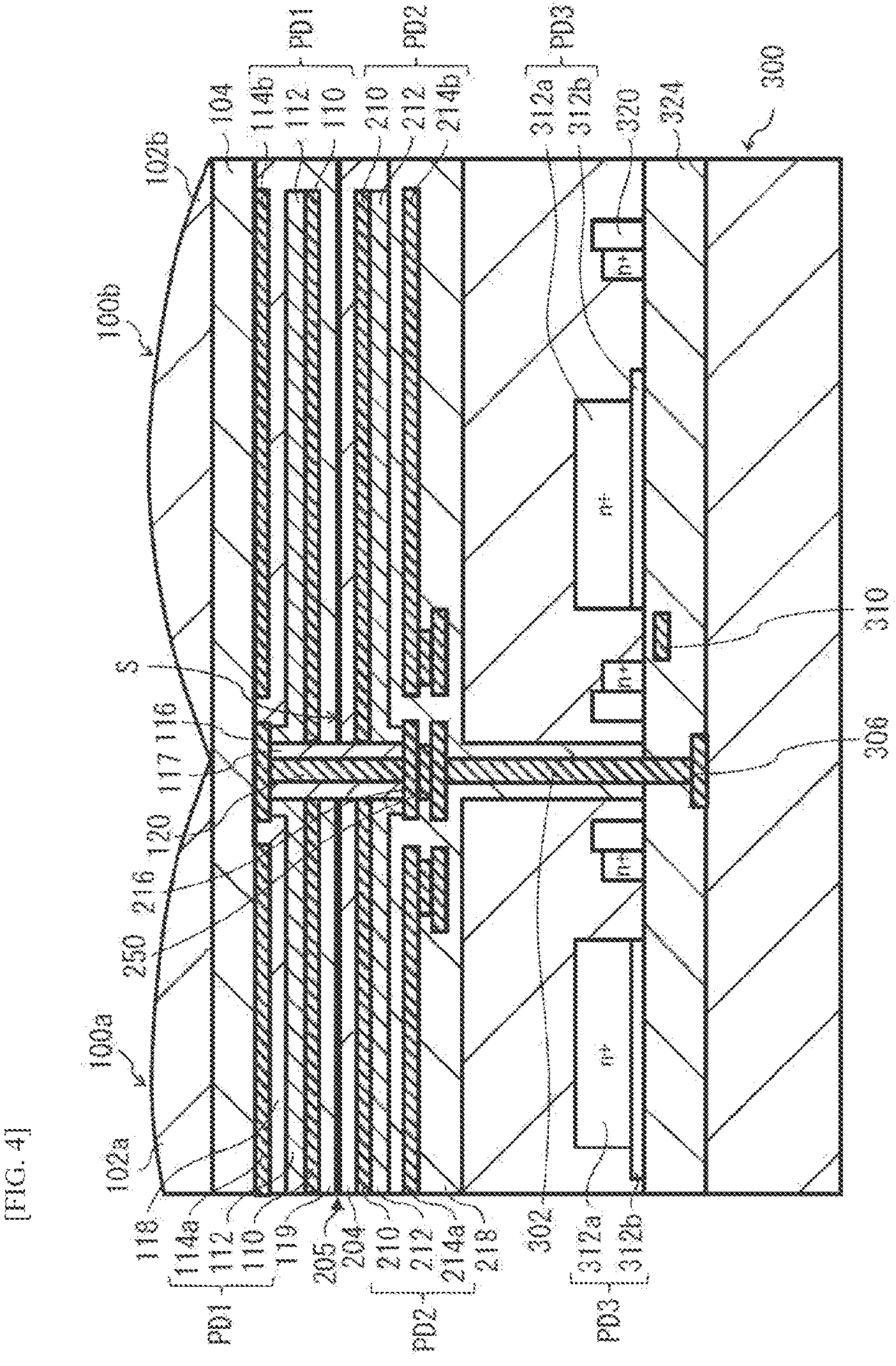
[FIG. 4]
PD1
PD2
PD3
300
104
102b
114b
112
110
210
212
214b
312a
312b
320
324
100b
S
116
117
120
216
250
100a
102a
118
114a
119
205
204
214a
218
302
306
310
n+

[ FIG. 5 ]
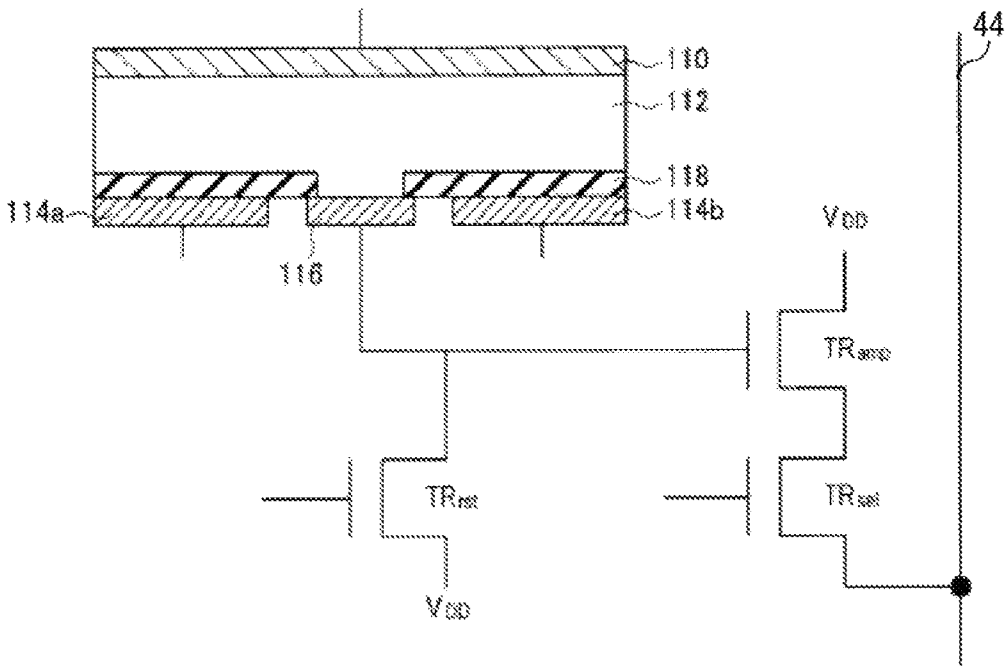
[ FIG. 6 ]
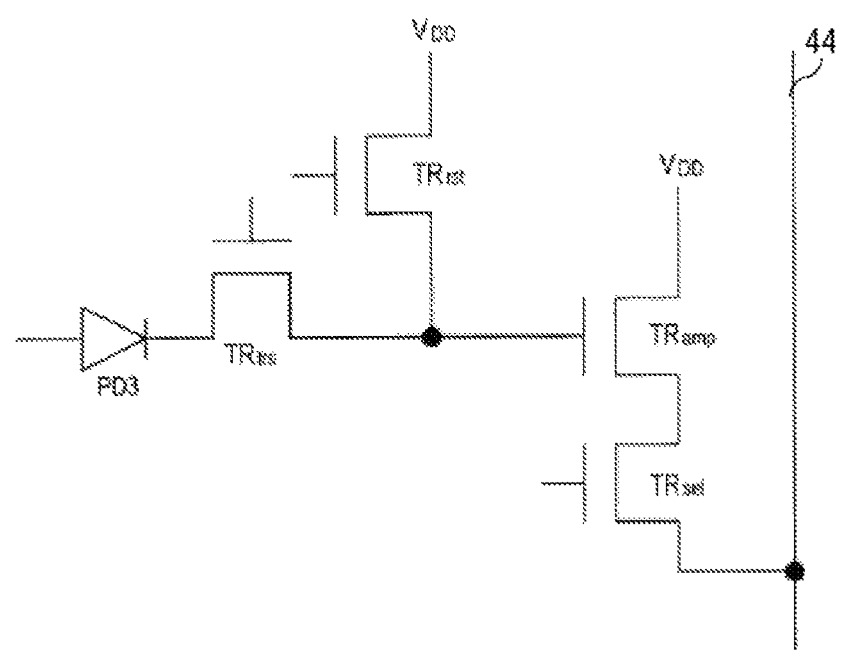

[FIG. 7]
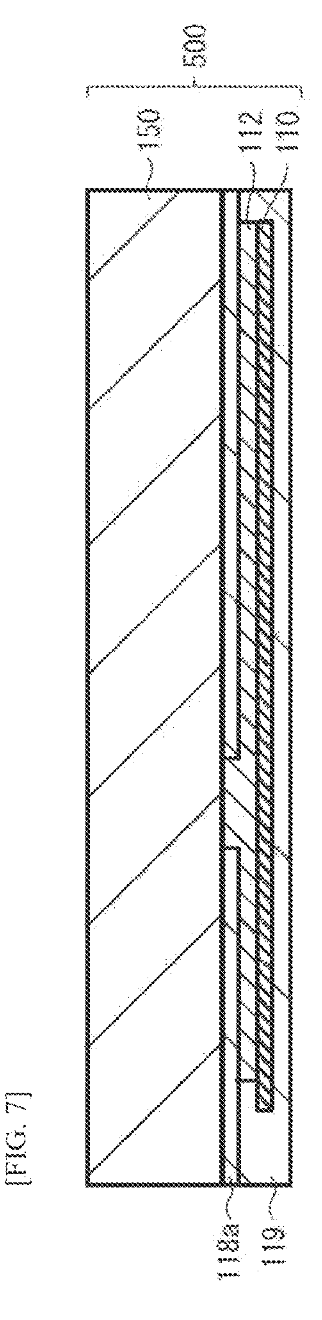
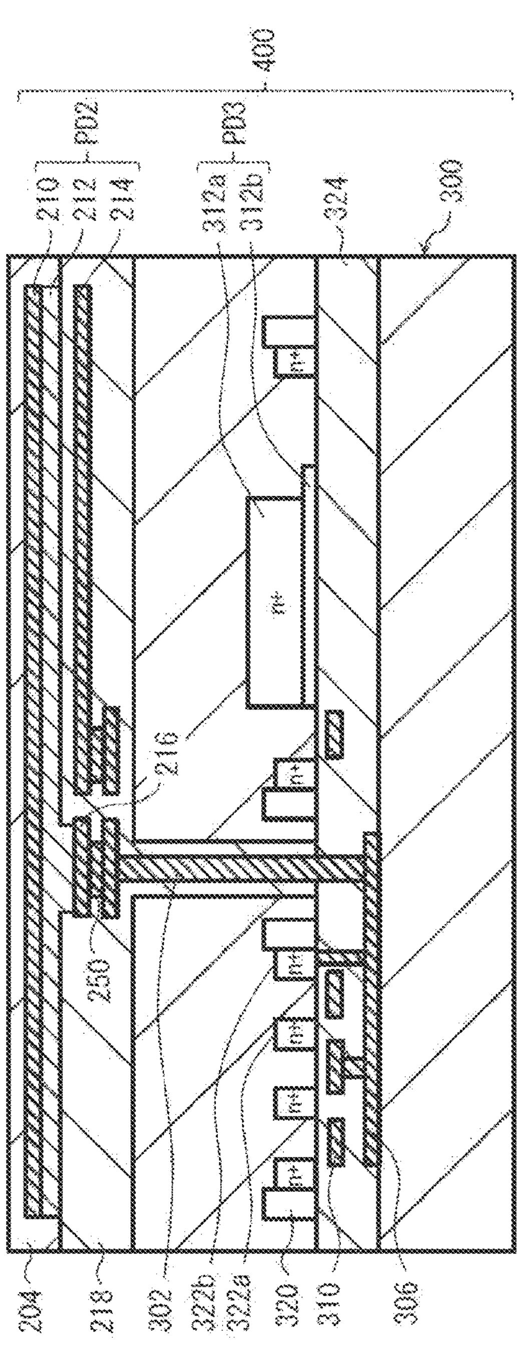

[ FIG. 8 ]
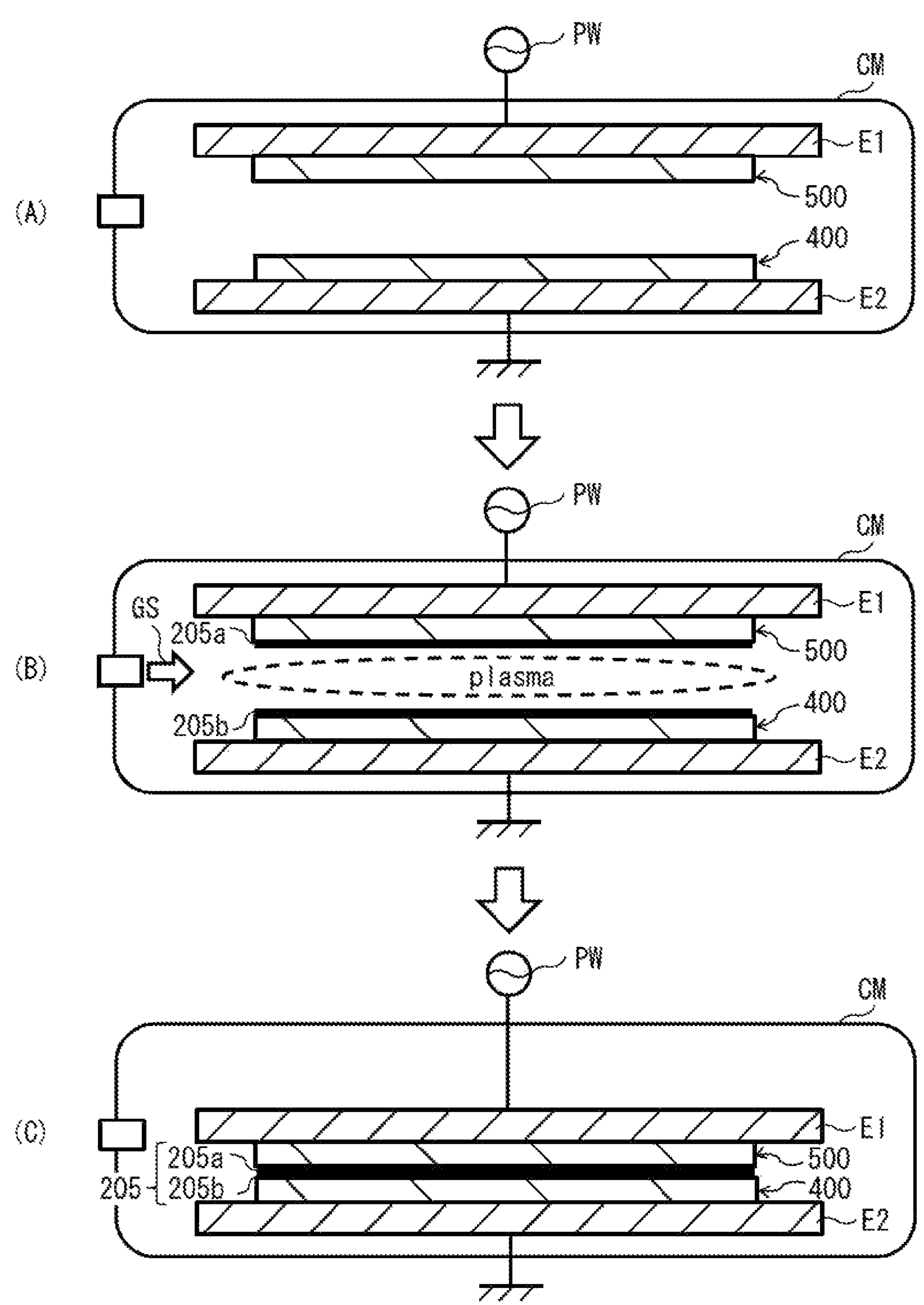

[ FIG. 9 ]
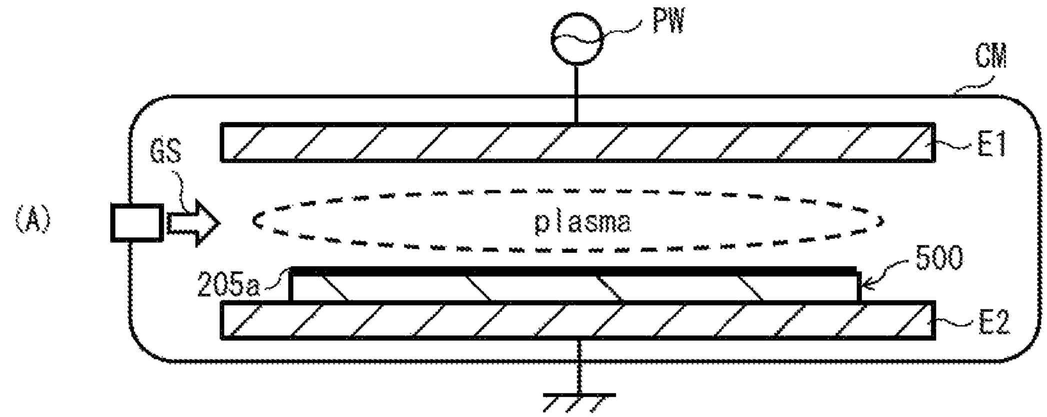
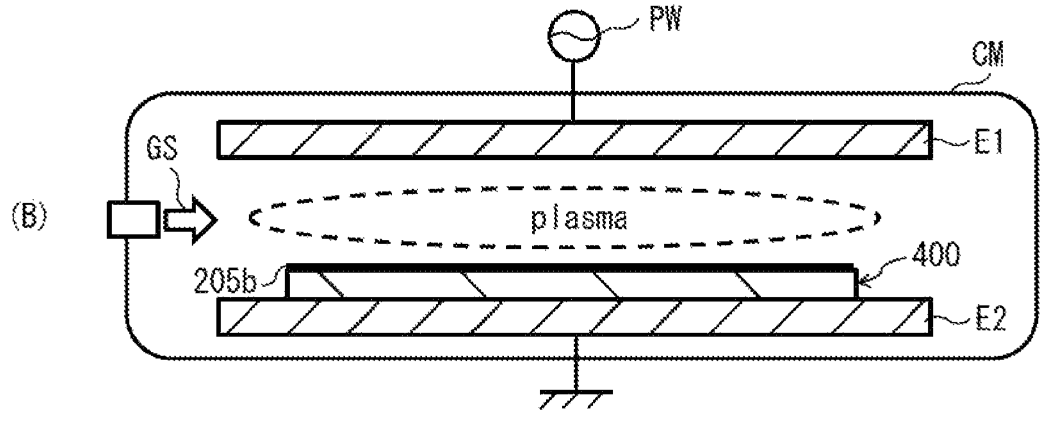
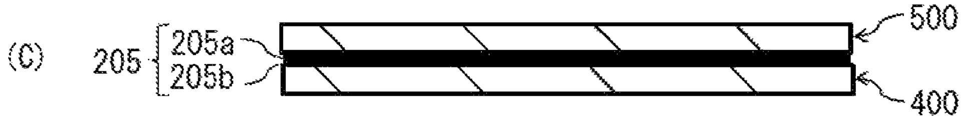

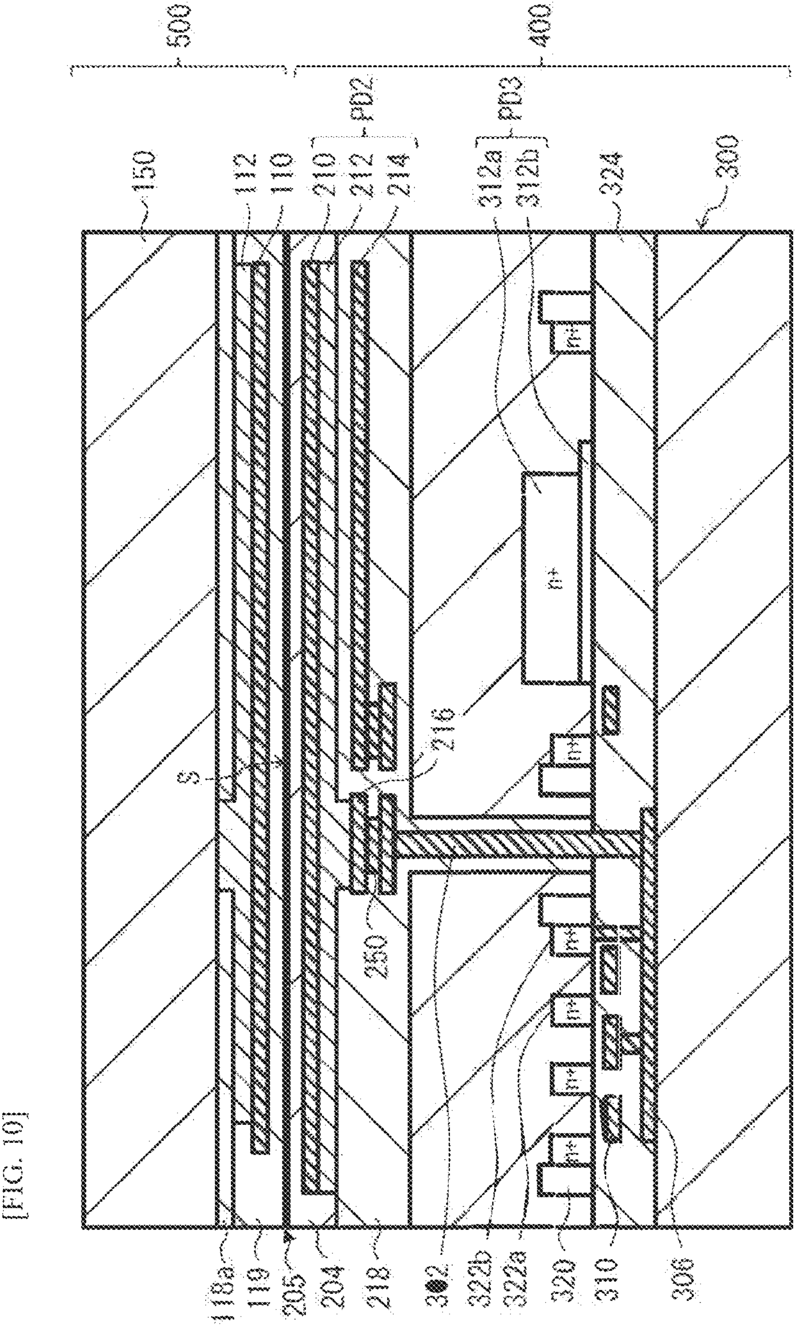
[FIG. 10]
500
400
PD2
PD3
150
112
110
210
212
214
312a
312b
324
300
S
216
250
n+
118a
119
205
204
218
302
322b
322a
320
310
306

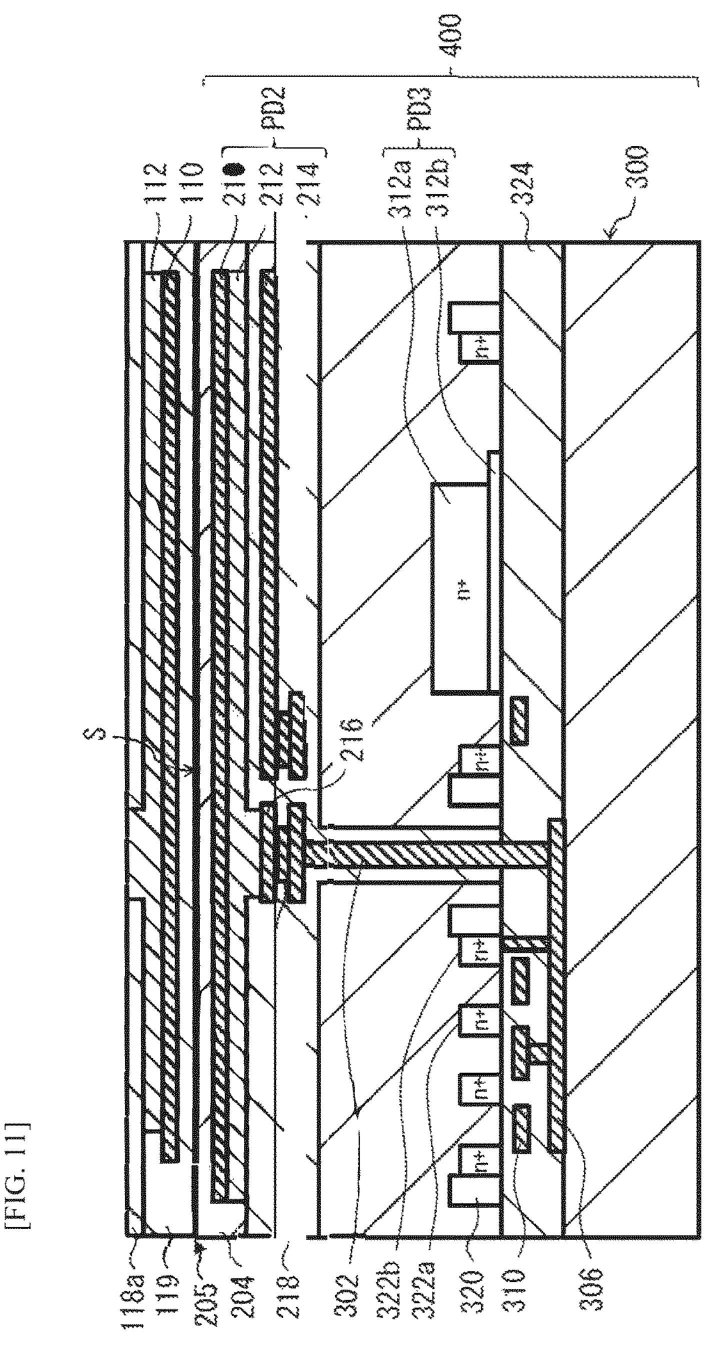
[FIG. 11]
400
PD2
PD3
112
110
210
212
214
312a
312b
324
300
S
216
n+
118a
119
205
204
218
302
322b
322a
320
310
306

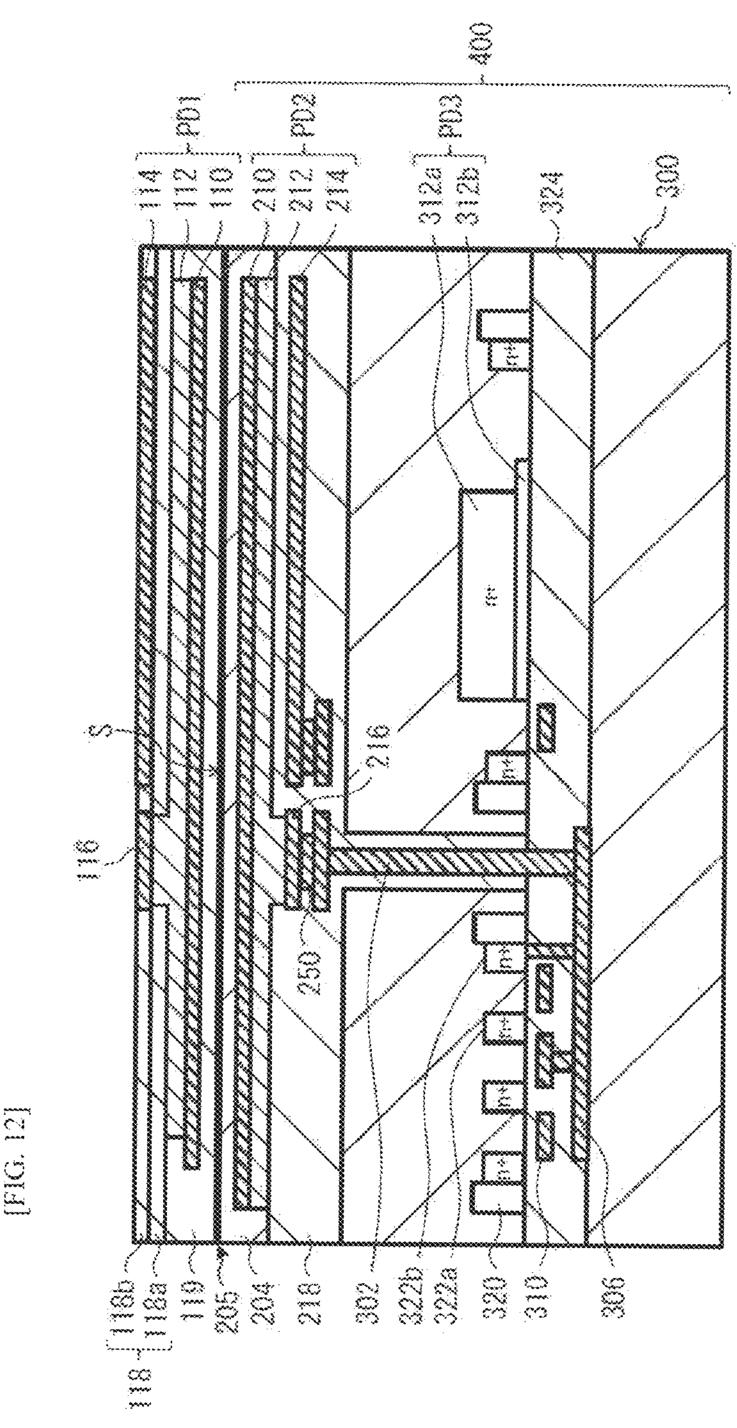
[FIG. 12]
400
PD1
PD2
PD3
114
112
110
210
212
214
312a
312b
324
300
S
116
216
250
118
118b
118a
119
205
204
218
302
322b
322a
320
310
306

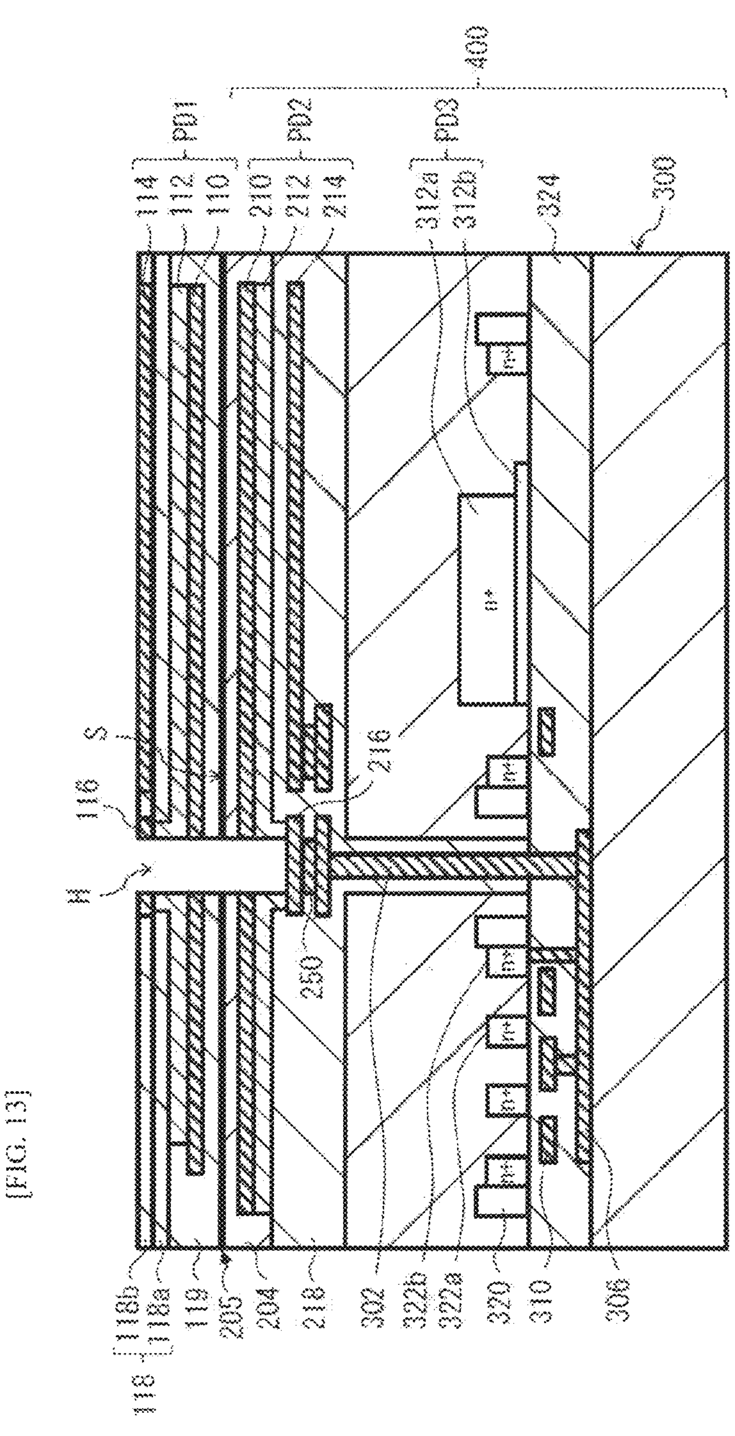
[FIG. 13]
400
PD1
PD2
PD3
114
112
110
210
212
214
312a
312b
324
300
S
116
H
216
250
118
118b
118a
119
205
204
218
302
322b
322a
320
310
306

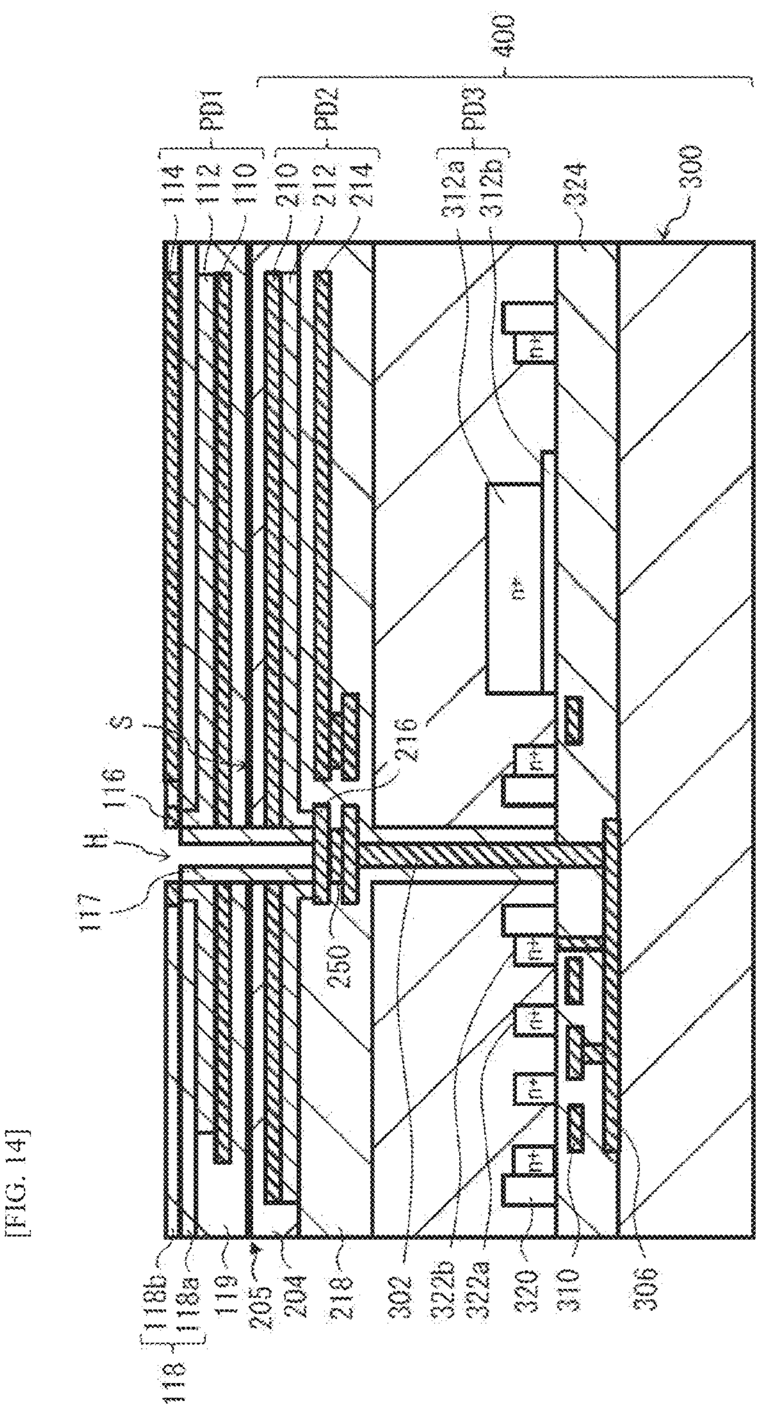
[FIG. 14]

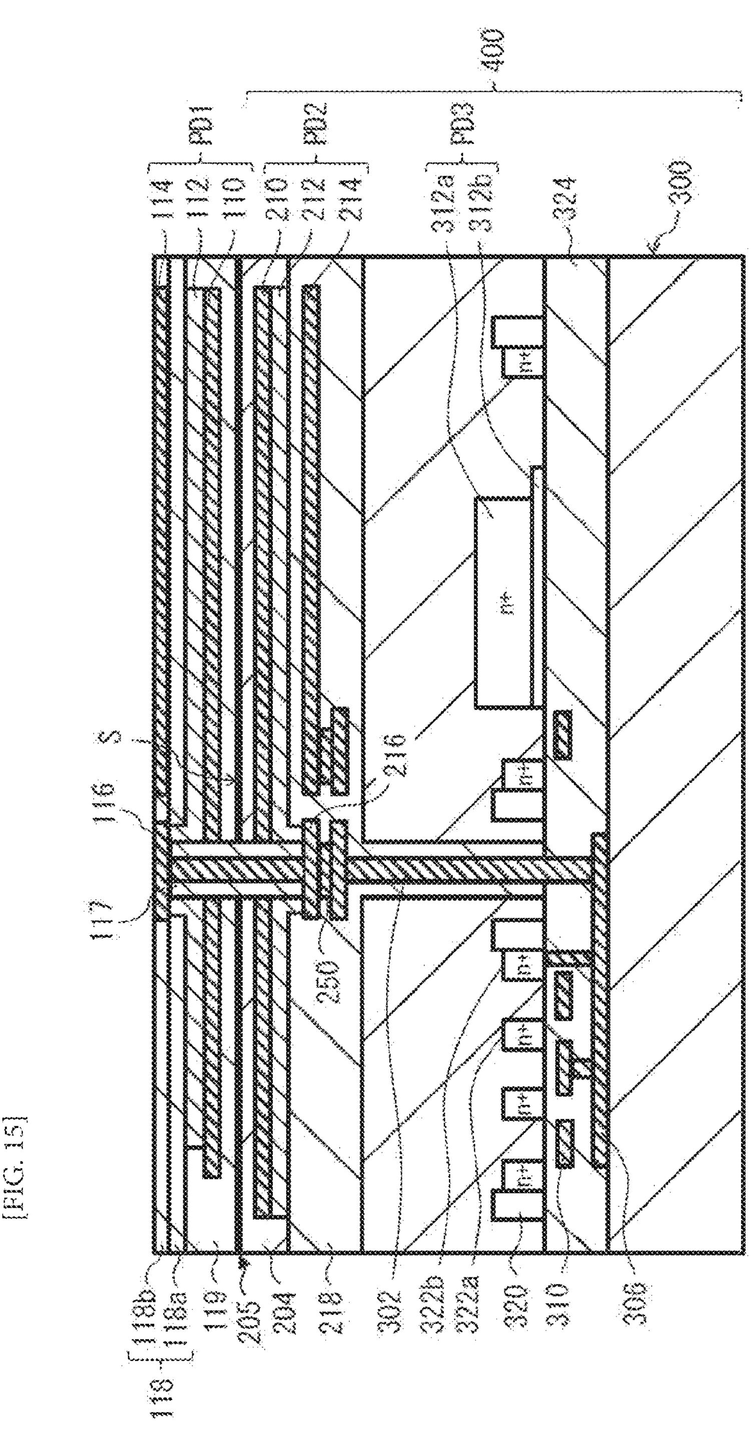
[FIG. 15]
400
PD1
PD2
PD3
114
112
110
210
212
214
312a
312b
324
300
S
116
216
117
250
118
118b
118a
119
205
204
218
302
322b
322a
320
310
306
n+

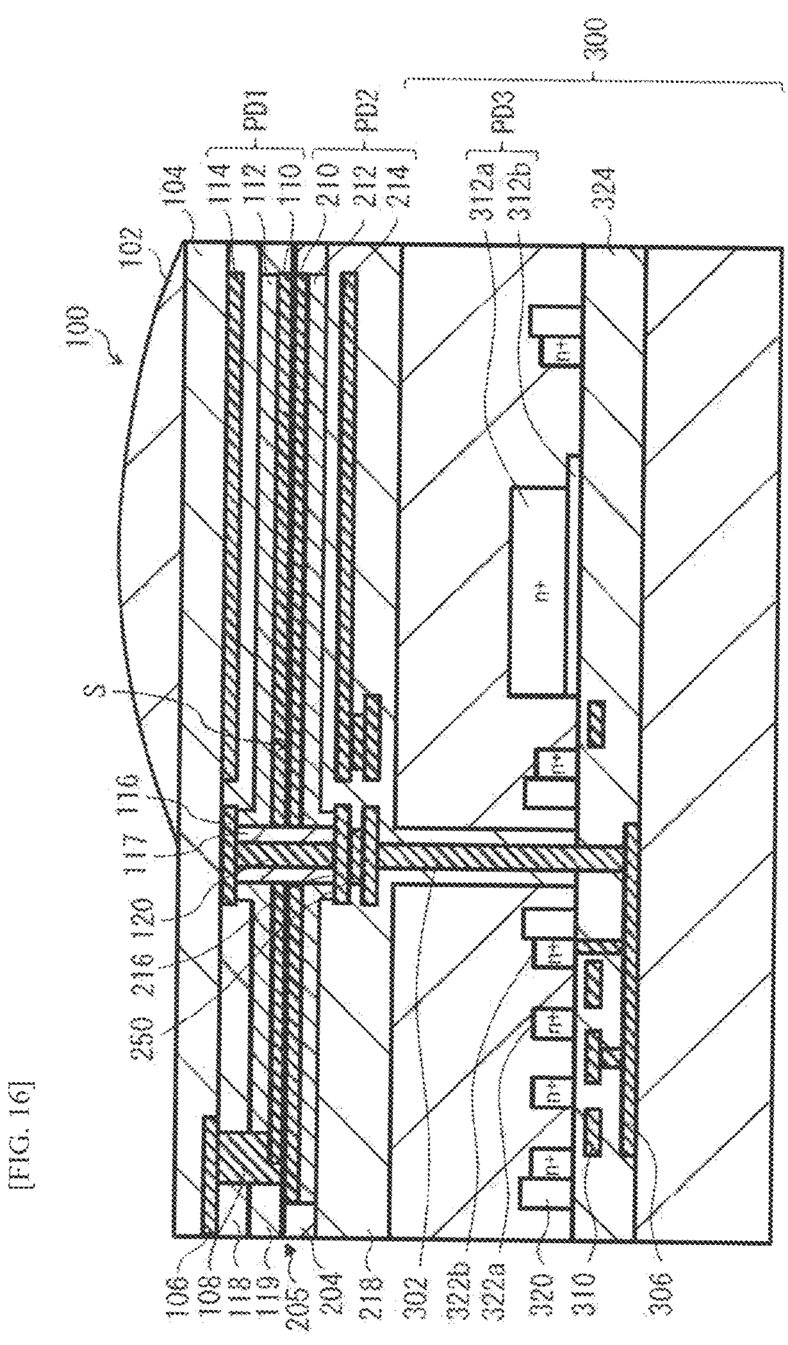
[FIG. 16]

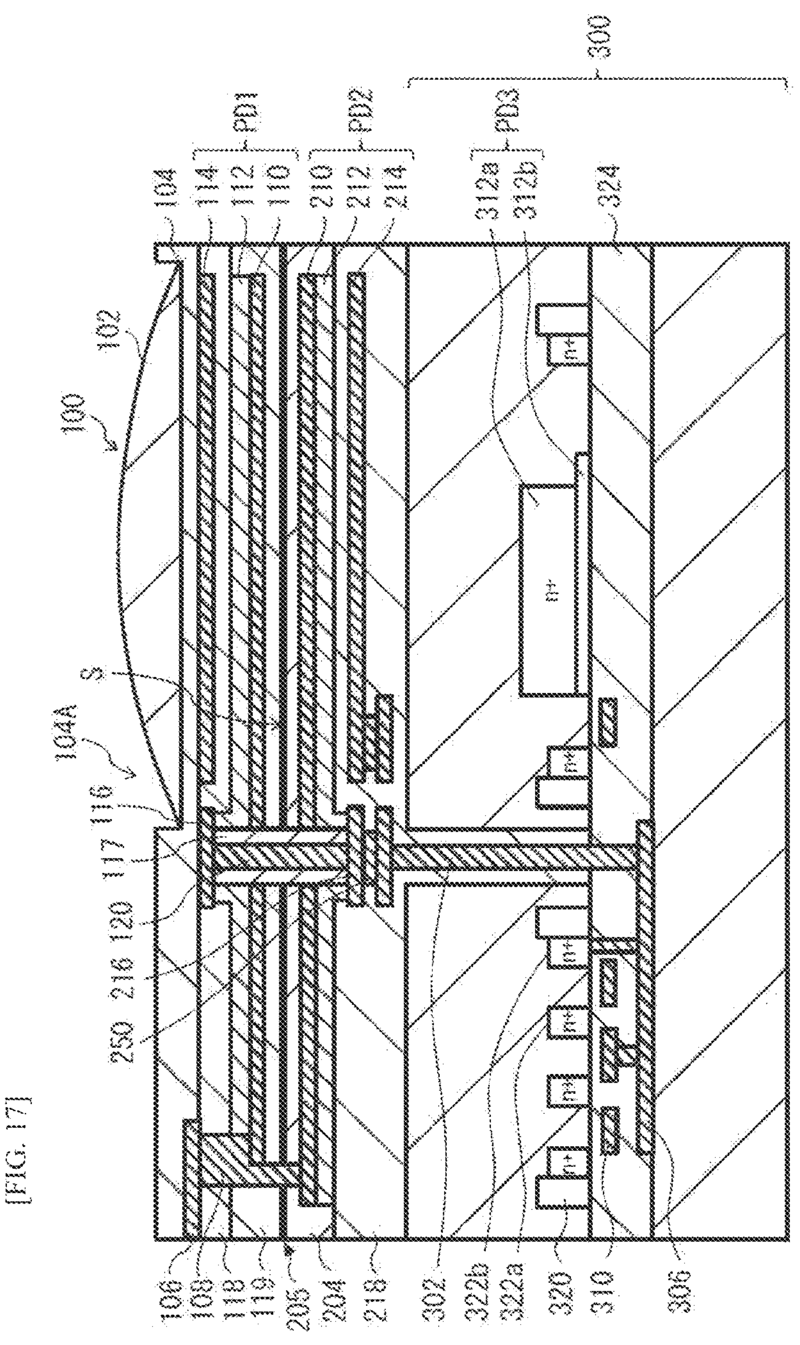
[FIG. 17]
100
102
104
104A
S
116
117
120
216
250
106
108
118
119
205
204
218
302
322b
322a
320
310
306
114
112
110
210
212
214
PD1
PD2
PD3
312a
312b
324
300
n+

[FIG. 18]
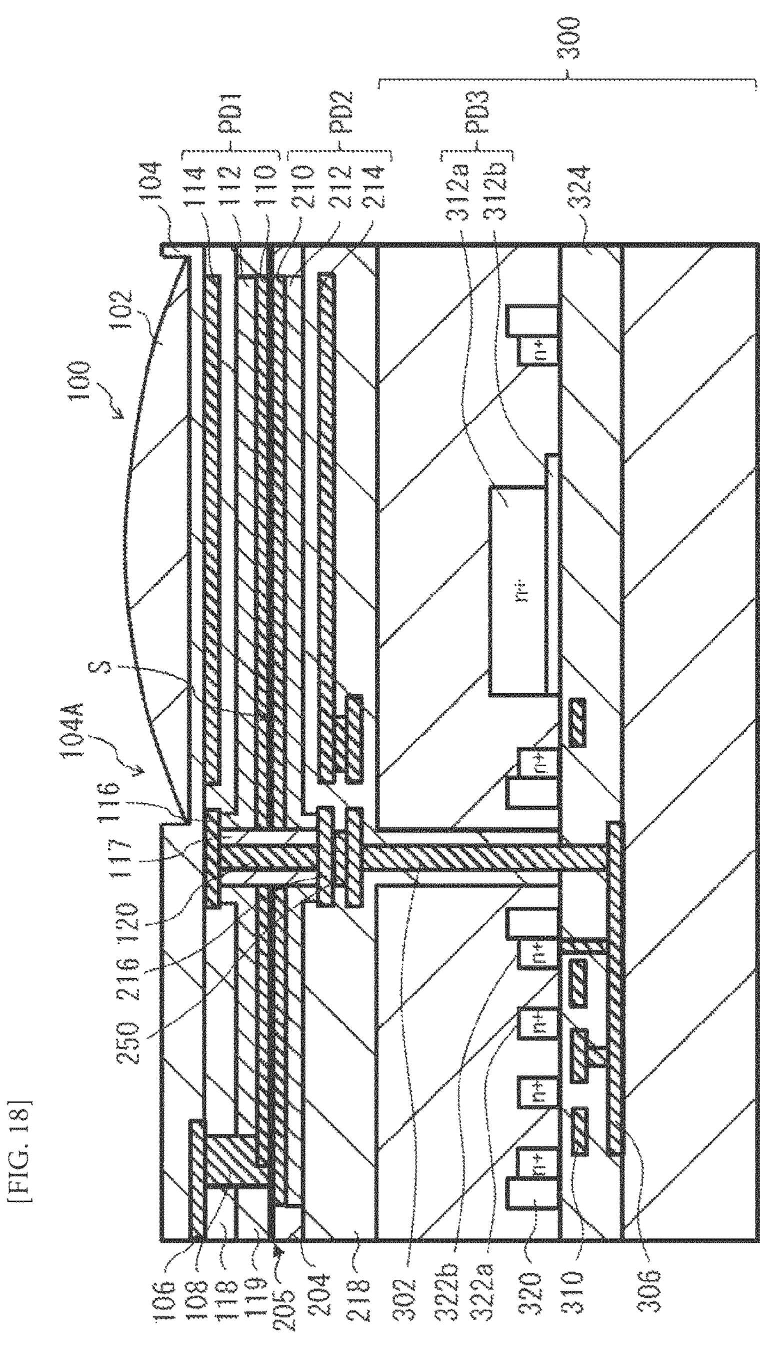

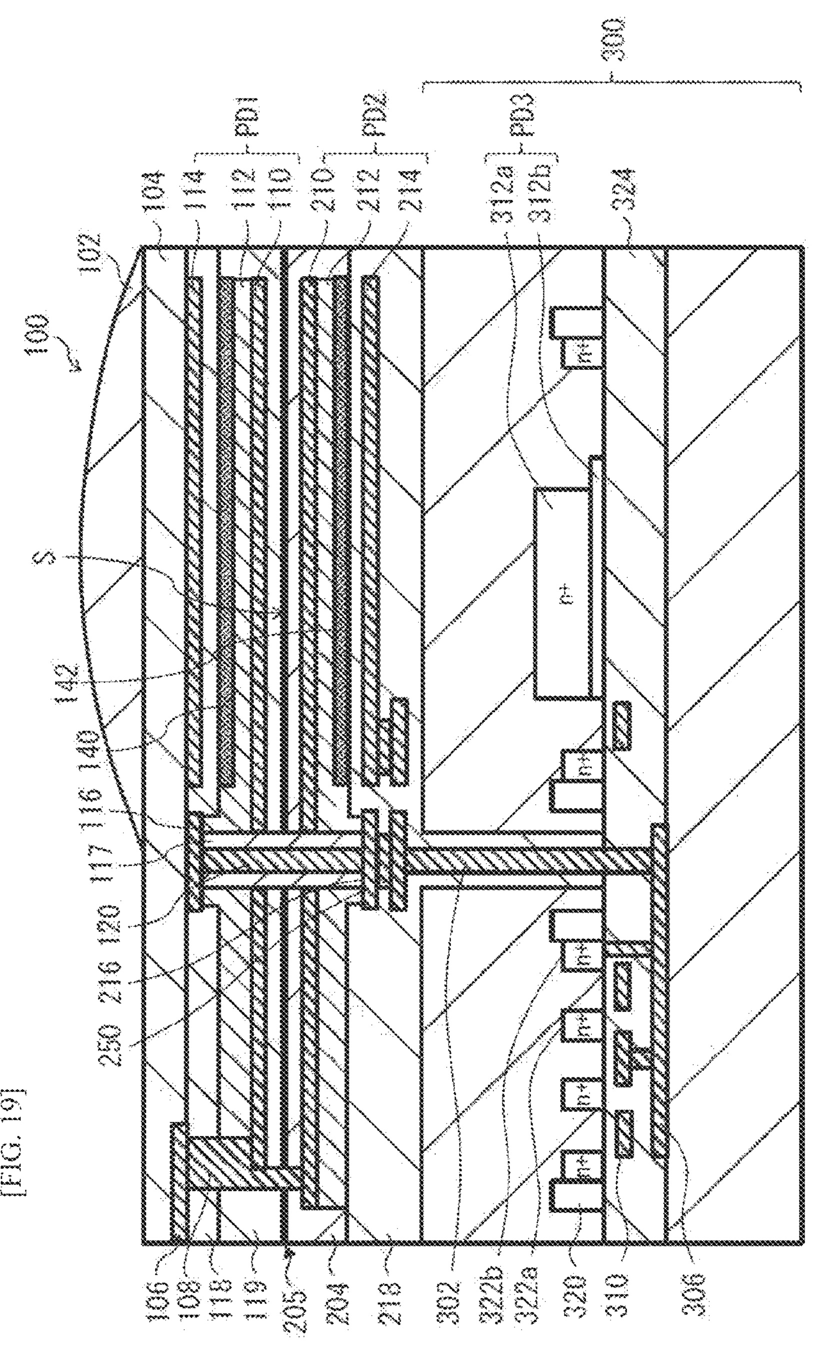
[FIG. 19]
100
102
104
114
112
110
PD1
210
212
214
PD2
300
PD3
312a
312b
324
S
142
140
116
117
120
216
250
106
108
118
119
205
204
218
302
322b
322a
320
310
306
n+

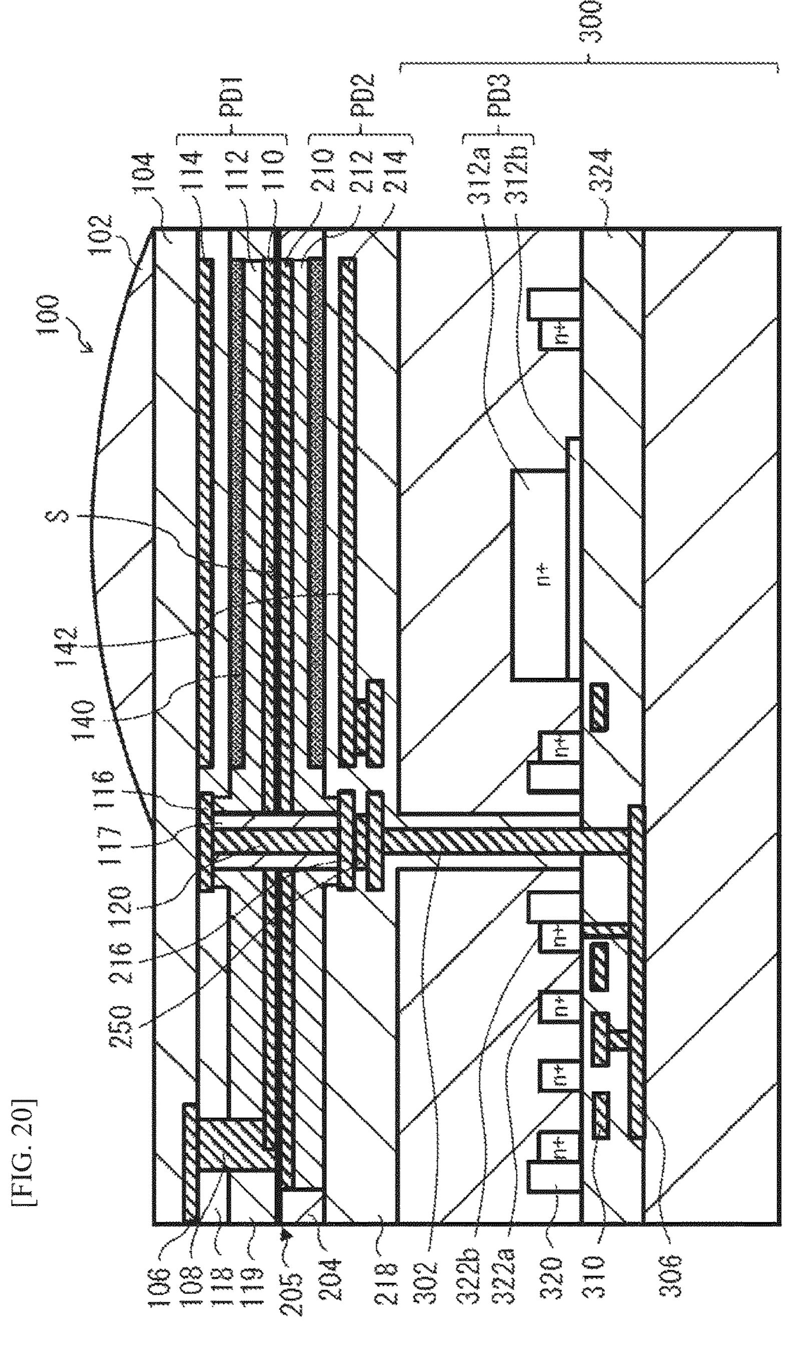
[FIG. 20]
100
102
104
114
112
110
PD1
210
212
214
PD2
300
PD3
312a
312b
324
S
142
140
116
117
120
216
250
106
108
118
119
205
204
218
302
322b
322a
320
310
306
n+

[ FIG. 21 ]
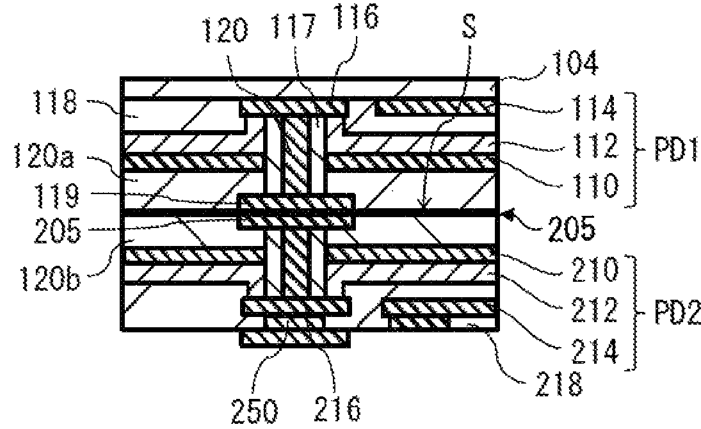
[ FIG. 22 ]
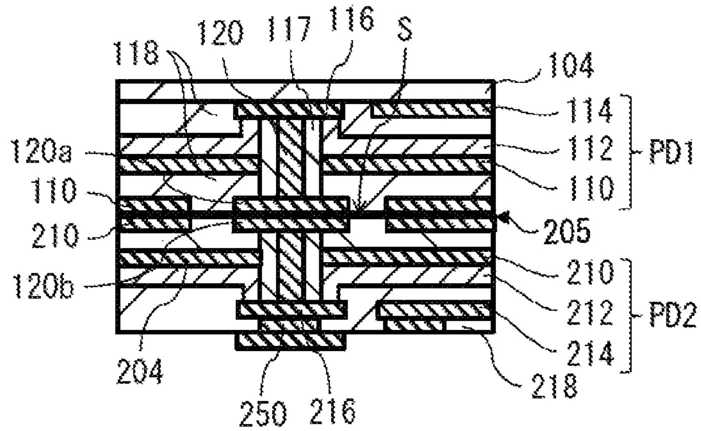

[ FIG. 23 ]
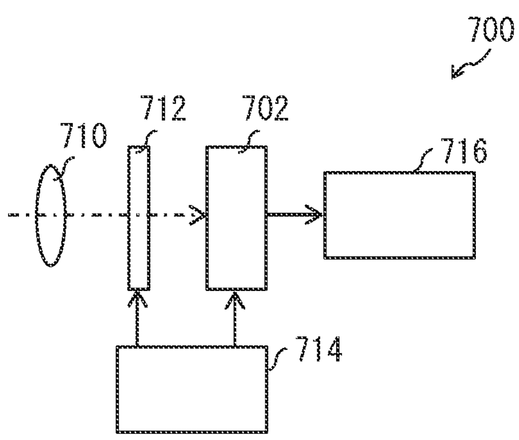

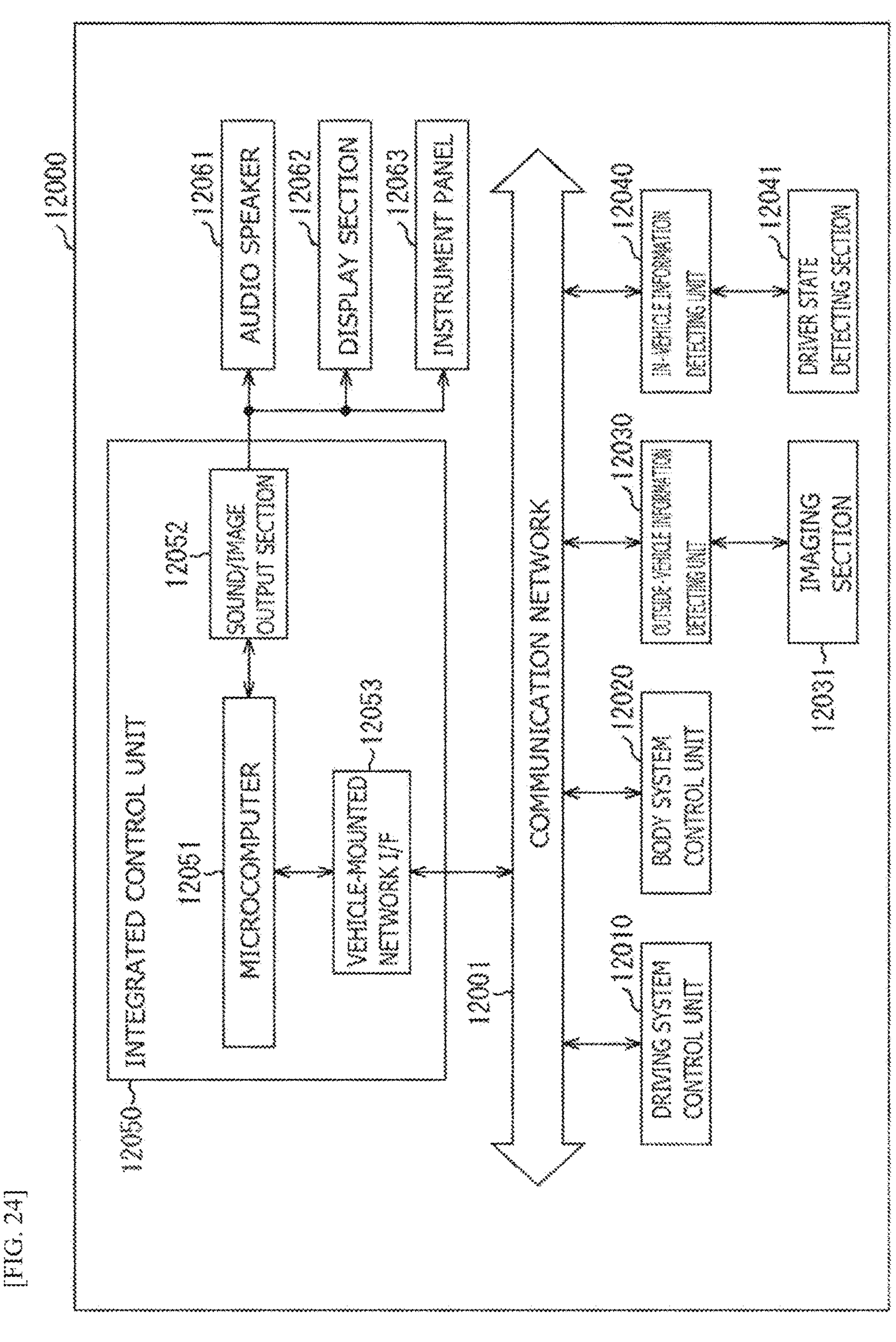
[FIG. 24]
12000
12050
INTEGRATED CONTROL UNIT
12051
MICROCOMPUTER
12052
SOUND/IMAGE OUTPUT SECTION
12053
VEHICLE-MOUNTED NETWORK I/F
12061
AUDIO SPEAKER
12062
DISPLAY SECTION
12063
INSTRUMENT PANEL
12001
COMMUNICATION NETWORK
12010
DRIVING SYSTEM CONTROL UNIT
12020
BODY SYSTEM CONTROL UNIT
12030
OUTSIDE-VEHICLE INFORMATION DETECTING UNIT
12031
IMAGING SECTION
12040
IN-VEHICLE INFORMATION DETECTING UNIT
12041
DRIVER STATE DETECTING SECTION

[ FIG. 25 ]
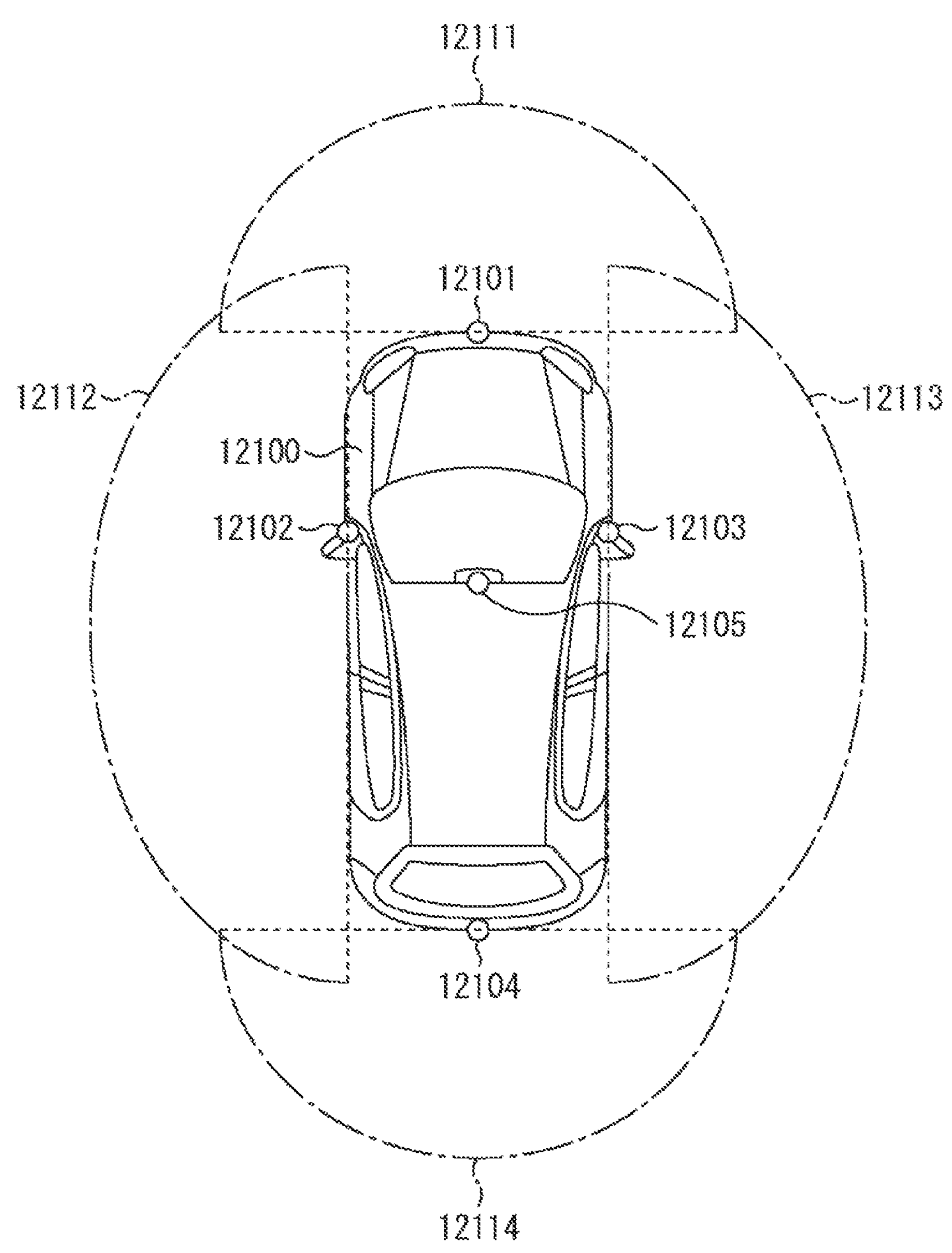

[FIG. 26]
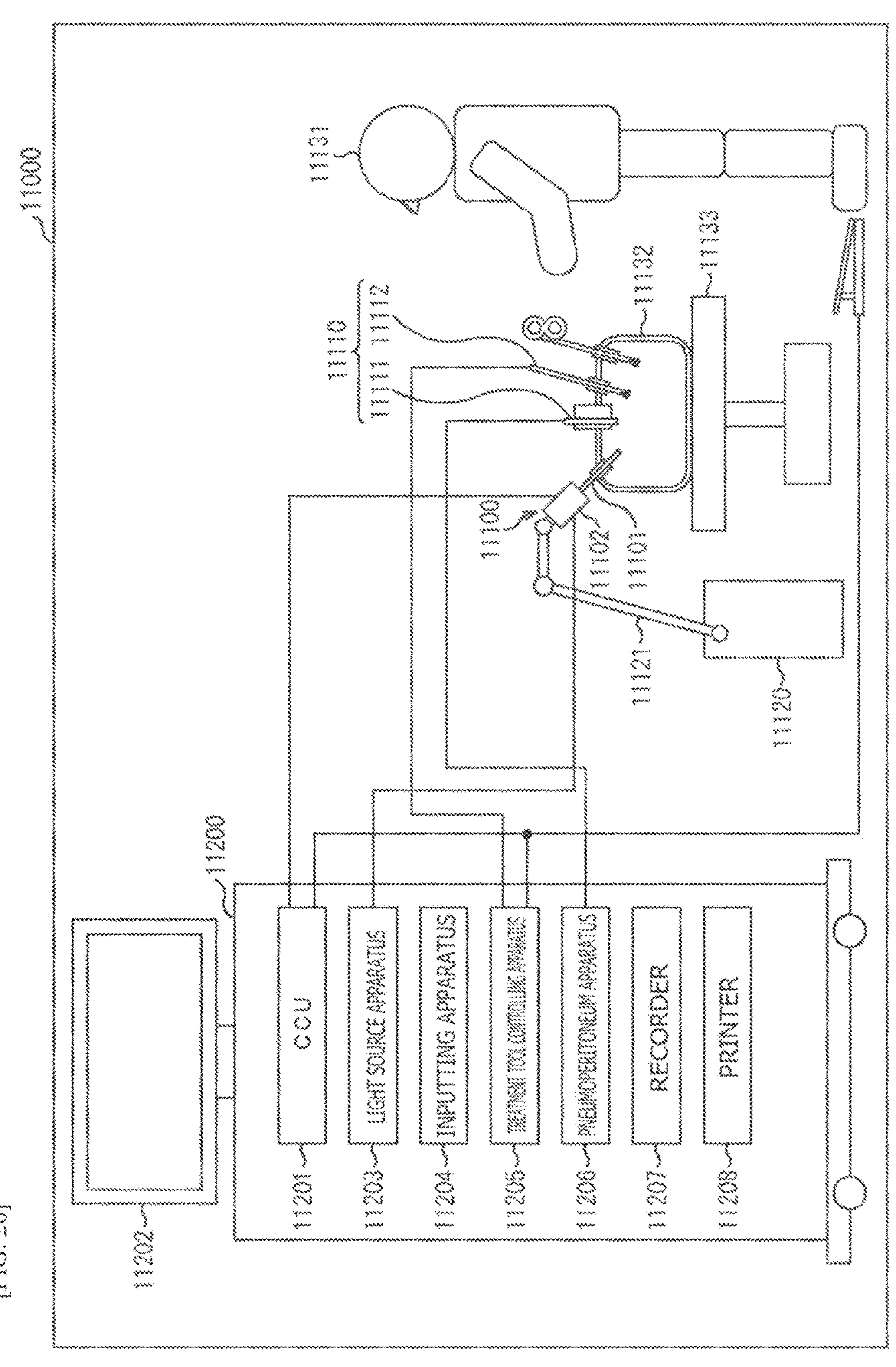

[ FIG. 27 ]
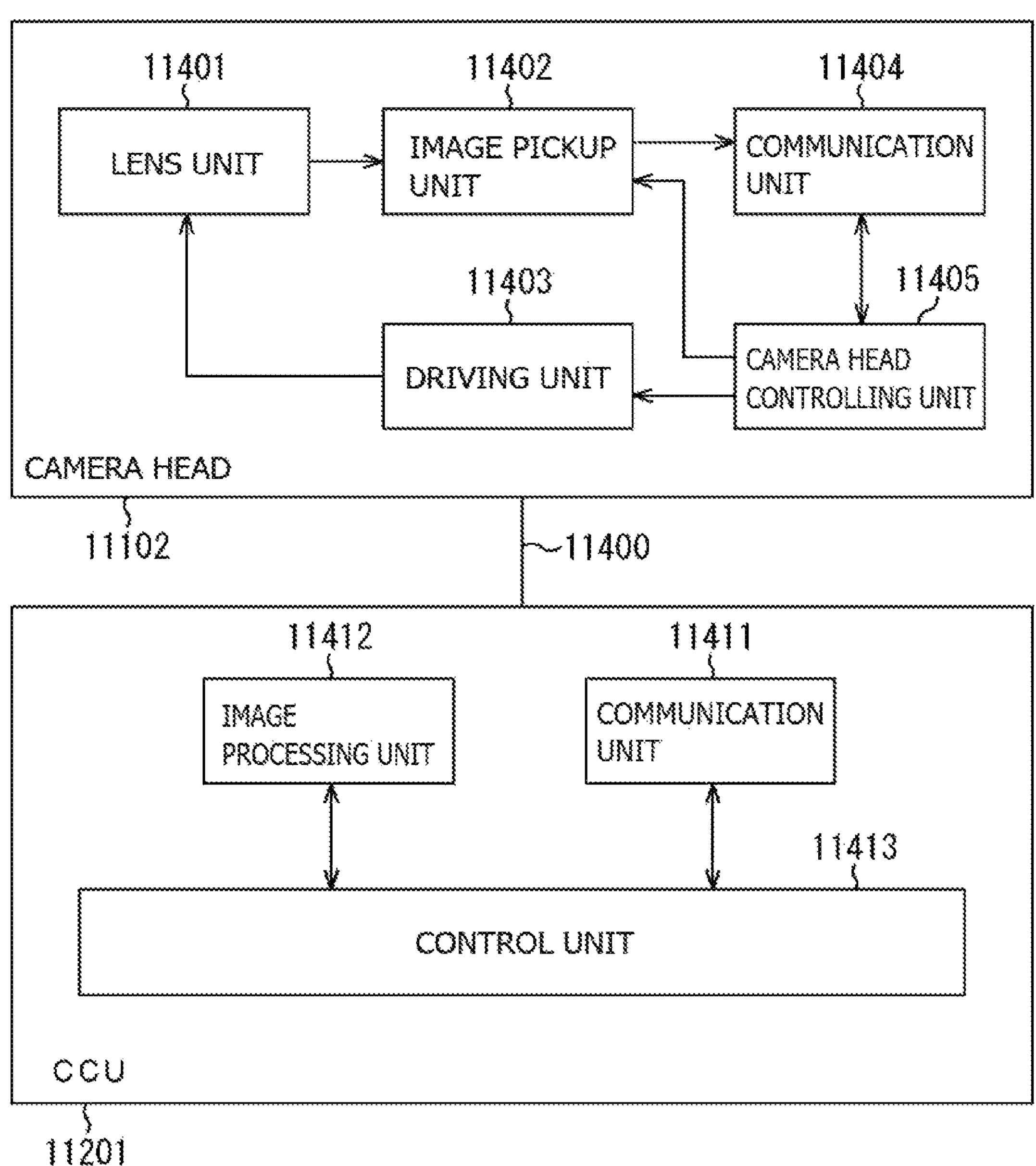

SOLID-STATE IMAGING DEVICE AND METHOD OF MANUFACTURING SOLID-STATE IMAGING DEVICE

TECHNICAL FIELD

The present disclosure relates to a solid-state imaging device, and a method of manufacturing a solid-state imaging device.

BACKGROUND ART

A photoelectric converter that uses a material having a wavelength selectivity such as an organic semiconductor material is able to perform photoelectric conversion of light in a specific wavelength band. For example, PTLs 1 to 4 each disclose a solid-state imaging device including such a photoelectric converter for each pixel.

CITATION LIST

Patent Literature

PTL 1: Japanese Unexamined Patent Application Publication No. 2005-51115

PTL 2: Japanese Unexamined Patent Application Publication No. 2003-332551

PTL 3: Japanese Unexamined Patent Application Publication No. 2011-29337

PTL 4: Japanese Unexamined Patent Application Publication No. 2017-157816

SUMMARY OF THE INVENTION

Incidentally, in solid-state imaging devices described above, in a case where a plurality of photoelectric converters having wavelength selectivities different from each other is provided for each pixel, in order to obtain, as pixel signals, electric charges generated by the respective photoelectric converters, it is necessary to provide a wiring line coupled to each of the photoelectric converters. The wiring line is one of essential elements for efficient output and transfer of the pixel signals. It is therefore desirable to provide a solid-state imaging device including a wiring line that allows for efficient output and transfer of the pixel signals, and a method of manufacturing the solid-state imaging device.

A solid-state imaging device according to an embodiment of the present disclosure includes: a plurality of photoelectric converters that is stacked on a semiconductor substrate, and has wavelength selectivities different from each other; and a wiring line that is formed on the semiconductor substrate, and is electrically coupled to the plurality of photoelectric converters. Each of the photoelectric converters includes a photoelectric conversion film, and a first electrode and a second electrode that are disposed with the photoelectric conversion film interposed therebetween. The wiring line extends in a direction normal to the semiconductor substrate, and includes a vertical wiring line formed in contact with the second electrode of each of the photoelectric converters.

In the solid-state imaging device according to the embodiment of the present disclosure, the vertical wiring line is formed that is in contact with the respective second electrodes of the plurality of photoelectric converters stacked on the semiconductor substrate. Accordingly, electric charges generated by the photoelectric converters are obtained via the common vertical wiring line, which makes it possible to simplify a wiring layout and shorten a wiring distance, as compared with a case where electric charges generated by each of the photoelectric converters are obtained via a wiring line provided for each of the photoelectric converters or via a wiring line routed to an in-plane direction of a stacking surface. As a result, it is possible to efficiently output and transfer pixel signals.

A method of manufacturing a solid-state imaging device according to an embodiment of the present disclosure includes the following two:

- bonding a first substrate, which includes a first lower electrode, a first photoelectric conversion film, and a first upper electrode on a first semiconductor substrate in this order from side of the first semiconductor substrate, and a second substrate, which includes a second photoelectric conversion film and a second upper electrode on a second semiconductor substrate in this order from side of the second semiconductor substrate, to each other to cause the first upper electrode and the second upper electrode to be opposed to each other; and
- after removing the second substrate, forming a counter electrode that is opposed to the second upper electrode with the second photoelectric conversion film interposed therebetween, and forming a vertical wiring line that is electrically coupled to the first lower electrode and the counter electrode by forming a groove section that reaches the first lower electrode from the counter electrode and filling the groove section with an electrically conductive material.

In the method of manufacturing the solid-state imaging device according to the embodiment of the present disclosure, the first substrate and the second substrate are bonded to each other, thereby stacking the first lower electrode and the counter electrode, and forming a vertical wiring line to be in contact with the first lower electrode and the counter electrode that are stacked. Accordingly, electric charges generated by the first photoelectric conversion film and the second photoelectric conversion film are obtained via the common vertical wiring line, which makes it possible to simplify a wiring layout, and shorten a wiring distance, as compared with a case where electric charges generated by each of the first photoelectric conversion film and the second photoelectric conversion film are obtained via a wiring line provided for each of the first photoelectric conversion film and the second photoelectric conversion film or via a wiring line routed to an in-plane direction of a stacking surface. As a result, it is possible to efficiently output and transfer pixel signals.

BRIEF DESCRIPTION OF DRAWINGS

FIG. 1 is a diagram illustrating a schematic configuration example of a solid-state imaging device according to an embodiment of the present disclosure.

FIG. 2 is a diagram illustrating a planar configuration example of the solid-state imaging device.

FIG. 3 is a diagram illustrating a cross-sectional configuration example taken along a line A-A' of FIG. 2.

FIG. 4 is a diagram illustrating a cross-sectional configuration example taken along a line B-B' of FIG. 2.

FIG. 5 is a diagram illustrating a cross-sectional configuration example of a photodiode included in the solid-state imaging device and a circuit configuration example of a pixel circuit.

FIG. 6 is a diagram illustrating a cross-sectional configuration example of the photodiode included in the solid-state imaging device and a circuit configuration example of the pixel circuit.

FIG. 7 is a diagram for describing a process of manufacturing the solid-state imaging device.

FIG. 8 is a diagram for describing a manufacturing process subsequent to FIG. 7.

FIG. 9 is a diagram for describing a manufacturing process subsequent to FIG. 7.

FIG. 10 is a diagram for describing a manufacturing process subsequent to FIG. 8 and FIG. 9.

FIG. 11 is a diagram for describing a manufacturing process subsequent to FIG. 10.

FIG. 12 is a diagram for describing a manufacturing process subsequent to FIG. 11.

FIG. 13 is a diagram for describing a manufacturing process subsequent to FIG. 12.

FIG. 14 is a diagram for describing a manufacturing process subsequent to FIG. 13.

FIG. 15 is a diagram for describing a manufacturing process subsequent to FIG. 14.

FIG. 16 is a diagram illustrating a modification example of a cross-sectional configuration of the solid-state imaging device in FIG. 2.

FIG. 17 is a diagram illustrating a modification example of the cross-sectional configuration of the solid-state imaging device in FIG. 2.

FIG. 18 is a diagram illustrating a modification example of the cross-sectional configuration of the solid-state imaging device in FIG. 16.

FIG. 19 is a diagram illustrating a modification example of the cross-sectional configuration of the solid-state imaging device in FIG. 2.

FIG. 20 is a diagram illustrating a modification example of the cross-sectional configuration of the solid-state imaging device in FIG. 16.

FIG. 21 is a diagram illustrating a modification example of a cross-sectional configuration of a portion of the solid-state imaging device in FIG. 2, FIG. 17, or FIG. 19.

FIG. 22 is a diagram illustrating a modification example of a cross-sectional configuration of a portion of the solid-state imaging device in FIG. 16, FIG. 18, or FIG. 20.

FIG. 23 is a diagram illustrating an example of a schematic configuration of an imaging system including the solid-state imaging device according to any of the embodiment described above and the modification examples thereof.

FIG. 24 is a block diagram depicting an example of schematic configuration of a vehicle control system.

FIG. 25 is a diagram of assistance in explaining an example of installation positions of an outside-vehicle information detecting section and an imaging section.

FIG. 26 is a view depicting an example of a schematic configuration of an endoscopic surgery system.

FIG. 27 is a block diagram depicting an example of a functional configuration of a camera head and a camera control unit (CCU).

MODES FOR CARRYING OUT THE INVENTION

Hereinafter, description is given in detail of preferred embodiments of the present disclosure with reference to the accompanying drawings. It is to be noted that, in the present specification and drawings, repeated description is omitted for components substantially having the same functional configuration by assigning the same reference signs.

In addition, in the present specification and drawings, a plurality of components having substantially the same functional configuration are distinguished by adding different numbers to the ends of the same reference signs in some cases. It is to be noted that only the same reference sign is assigned to a plurality of components having substantially the same or similar functional configuration in a case where there is no particular need to distinguish them. In addition, similar components described in different embodiments are distinguished by adding different alphabet characters to the ends of the same reference signs in some cases. It is to be noted that only the same reference sign is assigned to the similar components in a case where there is no particular need to distinguish them.

In addition, the drawings to be referred to in the following description are intended to describe an embodiment of the present disclosure and promote an understanding thereof, and in some cases, shapes, dimensions, ratios, etc. illustrated in the drawings are different from reality for better understanding. Furthermore, it is possible to change a design of a solid-state imaging element illustrated in the drawings where appropriate upon consideration of the following description and the known art. In addition, in description using a cross-sectional view of the solid-state imaging element, an up-down direction of a stack structure of the solid-state imaging element corresponds to a relative direction in a case of assuming an incident surface where light enters of the solid-state imaging element as a top surface, and in some cases is different from an up-down direction in accordance with actual gravitational acceleration.

In addition, in the following description, expressions regarding a size and a shape do not mean only the same value as a numerical value defined mathematically and a shape defined geometrically, but include a case where there is an industrially acceptable difference in a process of manufacturing the solid-state imaging element and a shape similar to the shape.

Furthermore, in the following description of circuit configurations, unless otherwise specified, "coupling" refers to electrical coupling among a plurality of elements. Furthermore, "coupling" in the following description includes not only a case of coupling a plurality of elements directly and electrically but also a case of coupling a plurality of elements indirectly and electrically via another element.

It is to be noted that description is given in the following order.

1. Embodiment (solid-state imaging device) . . . FIGS. 1 to 15
2. Modification Examples (solid-state imaging device) . . . FIGS. 16 to 22
3. Application Examples (imaging system) . . . FIG. 23
4. Practical Application Examples
    - Practical Application Example to Mobile Body . . . FIGS. 24 and 25
    - Practical Application Example to Endoscopic Surgery System . . . FIGS. 26 and 27

1. Embodiment

[Configuration]

FIG. 1 illustrates an example of a schematic configuration of a solid-state imaging device 1 according to an embodiment of the present disclosure. The solid-state imaging device 1 includes a pixel array section 10 in which a plurality of pixels 100 is arranged in a matrix form. The pixel array section 10 has a configuration in which the plurality of pixels 100 is stacked on a semiconductor substrate 300 including, for example, silicon. The pixel array section 10 has, for example, a configuration in which the plurality of pixels 100 is arranged in a matrix form on the semiconductor substrate 300. The semiconductor substrate 300 corresponds to a specific example of a "semiconductor substrate" of the present disclosure. The pixel array section 10 further includes a plurality of pixel circuits, a plurality of pixel drive lines 42, and a plurality of vertical signal lines 44 on the semiconductor substrate 300 including, for example, silicon. The pixel drive lines 42 are wiring lines to which a control signal for controlling output of electric charges stored in the pixels 100 is to be applied, and extend in a row direction, for example. The vertical signal lines 44 are wiring lines that each output a pixel signal outputted from each of the pixel circuits to a peripheral circuit section 80, and extend in a column direction, for example. The peripheral circuit section 80 is provided, for example, on the semiconductor substrate 300 and around the pixel array section 10. The peripheral circuit section 80 includes, for example, a vertical drive circuit section 32, a column signal processing circuit section 34, a horizontal drive circuit section 36, an output circuit section 38, a control circuit section 40, and the like. Respective blocks of the solid-state imaging device 1 according to the present embodiment are described in detail below.

(Pixel Array Section 10)

The pixel array section 10 includes the plurality of pixels 100. Each of the pixels 100 includes, for example, a normal pixel that generates a pixel signal for image generation, and a pair of pixels for phase difference detection that generate a pixel signal for focal point detection. Here, the pixel 100 means a solid-state imaging element (a unit pixel) that can be regarded as one unit that outputs one result for each color in a case of detecting light of each color and outputting a detection result. Each of the pixels 100 includes a plurality of photoelectric converters and a plurality of pixel transistors. The pixel array section 10 further includes the plurality of pixel circuits. Each of the pixel circuits generates, for example, pixel signals based on electric charges outputted from photoelectric converters PD, PD2, and PD3, and outputs the pixel signals. The pixel circuits each include a plurality of pixel transistors, and include, for example, a transfer transistor, a selection transistor, a reset transistor, an amplification transistor, and the like. The pixel transistors are, for example, MOS (Metal-Oxide-Semiconductor) transistors.

(Vertical Drive Circuit Section 32)

The vertical drive circuit section 32 includes, for example, a shift register. The vertical drive circuit section 32 selects the pixel drive line 42, and supplies a pulse for driving the pixels 100 to the selected pixel drive line 42 to drive the pixels 100 in a predetermined unit pixel row. The vertical drive circuit section 32 selectively scans the respective pixels 100 of the pixel array section 10 in a vertical direction (an up-down direction in FIG. 1) in sequence in the predetermined unit pixel row, and supplies pixel signals based on electric charges generated in accordance with an amount of light received by the photoelectric converters of each of the pixels 100 to the column signal processing circuit section 34 via the vertical signal line 44.

(Column Signal Processing Circuit Section 34)

The column signal processing circuit section 34 is disposed for each column of the pixels 100 and performs signal processing such as noise removal for each pixel column on the pixel signals outputted from the pixels 100 in the predetermined unit pixel row. The column signal processing circuit section 34 performs signal correlated double sampling (Correlated Double Sampling: CDS) processing to remove pixel-specific fixed pattern noise. The column signal processing circuit section 34 includes, for example, a single-slope A/D converter. The single-slope A/D converter includes, for example, a comparator and a counter circuit, and performs AD (Analog-Digital) conversion on the pixel signals.

(Horizontal Drive Circuit Section 36)

The horizontal drive circuit section 36 includes, for example, a shift register. The horizontal drive circuit section 36 sequentially outputs horizontal scanning pulses to sequentially select the column signal processing circuit sections 34 described above, and outputs the pixel signal from each of the column signal processing circuit sections 34 to a horizontal signal line 46.

(Output Circuit Section 38)

The output circuit section 38 performs signal processing on the pixel signals sequentially supplied from the column signal processing circuit sections 34 via the horizontal signal line 46, and outputs the thus-obtained pixel signals. The output circuit section 38 may function as a functional section that performs buffering (buffering), for example, or may perform processing such as black level adjustment, column variation correction, and various types of digital signal processing. The buffering means temporarily storing the pixel signals to compensate for differences in processing speed and transfer speed in exchanging the pixel signals. An input/output terminal 48 is a terminal for exchanging signals with an external device.

(Control Circuit Section 40)

The control circuit section 40 receives an input clock and data for giving an instruction on an operation mode or the like, and outputs data such as internal information of the pixel 100. The control circuit section 40 generates a clock signal and a control signal as references of operations of the vertical drive circuit section 32, the column signal processing circuit section 34 the horizontal drive circuit section 36, and the like, on the basis of a vertical synchronization signal; a horizontal synchronization signal, and a master clock. The control circuit section 40 outputs the generated clock signal and the generated control signal to the vertical drive circuit section 32, the column signal processing circuit section 34, the horizontal drive circuit section 36, and the like.

A planar configuration example of the solid-state imaging device 1 according to the present embodiment is not limited to the example illustrated in FIG. 1, and may include, for example, another circuit section or the like, (Pixel 100)

Next, description is given of a schematic configuration of stacking of the pixels 100 with reference to FIGS. 2 to 4. FIG. 2 illustrates a planar configuration example of the solid-state imaging device 1. FIG. 3 illustrates a cross-sectional configuration example taken along a line A-A' of FIG. 2. FIG. 4 illustrates a cross-sectional configuration example taken along a line B-B' of FIG. 2.

The solid-state imaging device 1 includes, in a center, the pixel array section 10 in which the plurality of pixels 100 is arranged in a matrix form, for example. The solid-state imaging device 1 further includes, for example, a pixel transistor region 70 and a peripheral circuit section 80 to surround the pixel array section 10. In the pixel transistor region 70, some of the plurality of pixel circuits (a plurality of pixel transistors) are provided. The peripheral circuit section 80 is provided on an outer peripheral portion of the pixel transistor region 70.

In the pixels 100 (or pixels 100*a* and 100*b*), a semiconductor region 312*a* having a second electrical conductivity type (e.g., N-type) is provided in a semiconductor region having a first electrical conductivity type (e.g., P-type) of the semiconductor substrate 300 including, for example, silicon. The photoelectric converter PD3 is formed by a PN junction of the semiconductor region 312*a* and a semiconductor region 312*b* having the first electrical conductivity type (e.g., P-type) that is positioned directly below the semiconductor region 312*a*. The photoelectric converter PD3 absorbs red light (e.g., light having a wavelength of 620 nm to 750 nm) to generate electric charges.

A wiring layer including a wiring line 306 formed using tungsten (W), aluminum (Al), copper (Cu), or the like is provided on side opposite to the semiconductor region 312*a* (on side opposite to a light receiving surface) of the semiconductor substrate 300. In this wiring layer, a plurality of electrodes 310 formed using W, Al, Cu, or the like is provided as gate electrodes of pixel circuits (a plurality of pixel transistors) that reads electric charges generated by the photoelectric converter PD3. Specifically, the electrode 310 is provided to be opposed to the semiconductor region having the first electrical conductivity type (e.g., P-type) in the semiconductor substrate 300 with an insulating film 324 interposed therebetween. Furthermore, in the semiconductor substrate 300, a semiconductor region 322*a* having the second electrical conductivity type (e.g., N-type) is provided to sandwich the above-described semiconductor region having the first electrical conductivity type (e.g., P-type), and the semiconductor region 322*a* is able to function as a source/drain region of the pixel circuit (a plurality of pixel transistors).

As illustrated in FIGS. 3 and 4, in the semiconductor substrate 300, a through electrode 302 for taking out, to the wiring line 306, electric charges generated by photoelectric conversion films 112 and 212 to be described later is provided to penetrate through a portion of the semiconductor substrate 300. The through electrode 302 extends in a direction normal to the semiconductor substrate 300, and has an upper end that is in contact with a wiring line 250, and a lower end that is in contact with a wiring line 306. That is, the through electrode 302 is a columnar vertical wiring line that extends from the wiring line 250 to a depth reaching the wiring line 306 (to a layer in which the pixel circuit is formed). The through electrode 302 corresponds to a specific example of a "vertical wiring line" of the present disclosure.

An insulating, film 218 including an aluminum oxide film ($Al_2O_3$) or the like is formed on an outer periphery of the through electrode 302 to prevent a short circuit between the through electrode 302 and the semiconductor substrate 300. The insulating film 218 preferably has a low interface state to reduce an interface state between the semiconductor substrate 300 and the insulating film 218 and suppress generation of a dark current from an interface between the semiconductor substrate 300 and the insulating film 218. In addition to the aluminum oxide film, it is possible to use, for example, a silicon oxide ($SiO_2$) film, a silicon nitride ($Si_3N_4$) film, a silicon oxynitride (SiON) film, a silicon carbide (SiC) a carbon-doped silicon oxide (SiCO) film, or the like as such an insulating film 218, and the insulating film 218 is not particularly limited. Examples of a method of forming these films may include a CVD (Chemical Vapor Deposition; CVD) method, a physical vapor deposition (Physical Vapor Deposition; PVD) method, an atomic layer deposition (Atomic Layer Deposition; ALD) method, and the like. The material and the method for forming the insulating film 218 are not particularly limited.

The through electrode 302 may be coupled, by the wiring line 306 provided in the wiring layer described above, to a floating diffusion section 322*b* and the electrode 310 that are provided in the semiconductor region having the second electrical conductivity type (e.g., N-type) provided in the semiconductor substrate 300. The floating diffusion section 322*b* is a region that temporarily stores electric charges generated by the photoelectric conversion films 112 and 212. In the semiconductor substrate 300, an isolation insulating film 320 may be provided to be adjacent to the floating diffusion section 322*h* or a source/drain region (the semiconductor region 322*a*) of each pixel transistor.

As illustrated in FIGS. 3 and 4, the insulating film 218 that includes, for example, an $Al_2O_3$ film or the like and allows light to pass therethrough is provided on the semiconductor substrate 300. The insulating film 218 allows light to pass therethrough, which makes it possible for the photoelectric converter PD3 provided below the insulating film 218 to receive light and perform photoelectric conversion, that is, to detect light.

The insulating film 218 is provided with a wiring line 250 that is electrically coupled to the through electrode 302 and functions as a light-shielding film. For the wiring line 250, it is possible to use, for example, W and a stacked film of a titanium (Ti) film and a titanium nitride (TiN) film to be barrier metals. The material that forms the wiring line 250 is not particularly limited.

The photoelectric conversion film 212 is provided above the insulating film 218 to be sandwiched between the electrode 210 and the electrode 216. It is possible to configure a photoelectric converter PD2 with use of the photoelectric conversion film 212, the electrode 210, and the electrode 216. The photoelectric converter PD2 includes the photoelectric conversion film 212, and the electrodes 210 and 216 that are disposed with the photoelectric conversion film 212 interposed therebetween. The photoelectric converter PD2 has a configuration in which the electrode 216, the photoelectric conversion film 212, and the electrode 210 are stacked in this order from side of the semiconductor substrate 300. The photoelectric converter PD2 (the photoelectric conversion film 212) absorbs, for example, green light (e.g., light having a wavelength of 495 nm to 570 nm) to generate electric charges (photoelectric conversion).

The photoelectric converter PD2 corresponds to a specific example of a "photoelectric converter" or a "second photoelectric converter" of the present disclosure. The electrode 210 corresponds to a specific example of a "first electrode" or a "second upper electrode" of the present disclosure. The electrode 216 corresponds to a specific example of a "second electrode" or a "second lower electrode" of the present disclosure. The photoelectric conversion film 212 corresponds to a specific example of a "photoelectric conversion film" or a "second photoelectric conversion film" of the present disclosure.

It is possible to form the electrodes 210 and 216 using, for example, a transparent electrically conductive film that allows light to pass therethrough, such as an indium tin oxide including crystalline ITO and amorphous ITO) film. Materials that form the electrode 210 and the electrode 216 are not limited to ITO described above, and may include other materials. For example, the transparent electrically conductive film preferably includes a material having a band gap of 2.5 eV or more, preferably 3.1 eV or more, Example of a tin oxide-based material for the transparent electrically conductive film may include tin oxide, antimony-tin oxide ($SnO_2$ is doped with Sb as a dopant, ATO), fluorine-tin oxide ($SnO_2$ is doped with F as a dopant. e.g., FTO), and the like.

Examples of a zinc oxide-based material may include aluminum-zinc oxide (ZnO is doped with Al as a dopant, e.g., AZO), gallium-zinc oxide (ZnO is doped with Ga as a. dopant, e.g., GZO), indium-zinc oxide (ZnO is doped with In as a dopant, IZO), indium-gallium-zinc oxide ($ZnO_4$ is doped with In and Ga as dopants, e.g., IGZO), indium-tin-zinc oxide (ZnO is doped with In and Sn as dopants, e.g., ITZO), and the like. In addition, examples of other materials may include indium-gallium oxide ($Ga_2O_3$ is doped with In as a dopant, e.g., IGO), $CuInO_2$, $MgIn_2O_4$, CuI, $InSbO_4$, ZnMgO, CdO, $ZnSnO_3$, and the like. In addition, a material of the photoelectric conversion film 212 is described in detail later.

A wiring line 116 that is illustrated in FIG. 3 and is coupled to the electrode 210 is also able to function as a light-shielding film, and is able to be formed using a material such as W, Ti, TiN, Al, or Cu, for example. The material of the wiring line 116 is not limited thereto, and the wiring line 116 may be formed using any other material.

As illustrated in FIGS. 3 and 4, the photoelectric converter PD2 includes a storage electrode 214 (214*a* and 214*b*), which is opposed to the electrode 210 with the photoelectric conversion film 212 interposed therebetween, to temporarily store the electric charges generated by the photoelectric conversion film 212 in the photoelectric conversion film 212. Specifically, the storage electrode 214 is in contact with the photoelectric conversion film 212 with the insulating film 218 interposed therebetween, or with the insulating film 218 and an unillustrated semiconductor layer interposed therebetween. The storage electrode 214 and the electrode 216 are insulated from each other by the insulating film 218. The storage electrode 214 (214*a* and 214*b*) corresponds to a specific example of a "storage electrode" or a "second storage electrode" of the present disclosure. The insulating film 218 corresponds to a specific example of an "insulating layer" or a "second insulating layer" of the present disclosure.

The wiring lines 116 and 250, and the like are electrically coupled to the electrode 216 and the storage electrode 214, and a desired potential is applied to the electrode 216 and the storage electrode 214 with use of these wiring lines 116 and 250, and the like. Wiring lines 108 and 106, and the like are electrically coupled to the electrode 210, and a desired potential is applied to the electrode 210 with use of these wiring lines 108 and 106, and the like.

Furthermore, the electrode 216 is coupled to the floating diffusion section 322*b* provided in the semiconductor substrate 300 via the through electrode 302. Controlling a potential to be applied to the electrode 210 and the storage electrode 214 makes it possible to store electric charges generated by the photoelectric conversion film 212 in the photoelectric conversion film 212 and take out the electric charges to the floating diffusion section 322*b* via the electrode 216 and the through electrode 302. The storage electrode 214 is able to function as an electric charge storage electrode for attracting electric charges generated by the photoelectric conversion film 212 in accordance with an applied potential and storing the electric charges in the photoelectric conversion film 212. In order to effectively use light incident on the pixel 100, the storage electrode 214 is preferably provided to have a larger area than that of the electrode 216 as viewed from above the light receiving surface.

The storage electrode 214 is formed using a transparent electrically conductive film, similarly to the electrodes 210 and 216. Forming the electrodes 210 and 216, and the storage electrode 214 using the transparent electrically conductive films in such a manner makes it possible for the photoelectric converter PD3 to also detect light incident on the pixel 100. A film thickness of each of the electrodes 210 and 216, and the storage electrode 214 is 5 nm to 200 nm, and preferably about 30 nm to about 100 nm.

The insulating film 218 is provided between the electrode 216 and the storage electrode 214 and between the photoelectric conversion film 212 and the storage electrode 214 to electrically insulate them. The insulating film 218 may be a film that has fixed electric charges having the same polarity as electric charges generated by the photoelectric conversion film 212.

The through electrode 120 for taking out electric charges generated by the photoelectric conversion film 112 to the wiring line 306 is provided above the insulating film 218 to penetrate through the photoelectric converter PD2 and a photoelectric converter PD1 to be described later. The through electrode 120 corresponds to a specific example of a "vertical wiring line" of the present disclosure. The through electrode 120 is formed on the semiconductor substrate 300. The through electrode 120 is disposed at a position opposed to the through electrode 302 in the direction normal to the semiconductor substrate 300. A lower end of the through electrode 120 is in contact with the electrode 216 to be electrically coupled to the through electrode 302 via the electrode 216. An upper end of the through electrode 120 is in contact with an electrode 116 to be described later. That is, the through electrode 120 is electrically coupled to the photoelectric converters PD1 and PD2. The through electrode 120 is a vertical wiring line that extends in the direction normal to the semiconductor substrate 300 and is formed in contact with the electrode 116 of the photoelectric converter PD1 (to be described later) and the electrode 216 of the photoelectric converter PD2. The through electrode 120 includes a columnar electrically conductive member that penetrates through the same plane as junction surfaces S to be described later and has not been subjected to junction processing. That is, the through electrode 120 does not include a stacked body configured by stacking an electrically conductive member in the direction normal to the semiconductor substrate 300, but a single electrically conductive member.

An insulating film 117 including an aluminum oxide film ($Al_2O_3$) or the like is formed on an outer periphery of the through electrode 120 to prevent a short circuit between the through electrode 120 and electrodes 110 and 210 of the photoelectric converters PD1 and PD2. As the insulating film 117, it is possible to use, for example, a silicon oxide ($SiO_2$) film, a silicon nitride ($Si_3N_4$) film, a silicon oxynitride (SiON) film, a silicon carbide (SW) film, a carbon-doped silicon oxide (SiCO) film, or the like in addition to the aluminum oxide film, and the insulating film 117 is not particularly limited. Examples of a method of forming these films may include a CVD method, a PVD method, an ALD method, and the like. However, in the present embodiment, the material and the method for forming the insulating film 117 are not particularly limited.

A sealing film 204 that is in contact with the electrode 210 and seals the electrode 210 is provided above the electrode 210. The sealing film 204 corresponds to a specific example of a "second sealing film" of the present disclosure. Examples of a material of the sealing film 204 may include an inorganic oxide film, an inorganic nitride film, an inorganic oxynitride film, and the like that allow light to pass therethrough. As the material of the sealing film 204, it is possible to use, for example, $Al_2O_3$, $SiO_2$, $Si_3N_4$, SiON, SiC, SiCO, or the like, and the material of the sealing film 204 is not particularly limited.

A sealing film 119 that is in contact with the electrode 110 to be described later and seals the electrode 110 is provided above the sealing film 204. The sealing film 119 corresponds to a specific example of a "first sealing film" of the present disclosure. Examples of a material of the sealing film 119 may include an inorganic oxide film, an inorganic nitride film, an inorganic oxynitride film, and the like that allow light to pass therethrough. As the material of the sealing film 119, it is possible to use, for example, $Al_2O_3$, $SiO_2$, $Si_3N_4$, SiON, SiC, SiCO, or the like, and the material of the sealing film 119 is not particularly limited.

The sealing film 204 and the sealing film 119 have the junction surfaces S joined to each other by predetermined junction processing. The junction surface S corresponds to a specific example of a "junction surface" of the present disclosure. A carbon film 205 that joins the sealing film 204 and the sealing film 119 together is provided on the junction surfaces S. The carbon film 205 corresponds to a specific example of a "carbon film" of the present disclosure. The carbon film 205 is formed using, for example, diamond-like carbon (DLC) having a thickness of 1 to 5 molecular layers. The DLC is a transparent thin film, and does not obstruct light. The DLC may be doped with an impurity upon film formation. In this case. The DLC has semiconductivity, which allows the DLC to operate similarly to an IR cut filter.

The photoelectric conversion film 112 is provided above the sealing film 119 to be sandwiched between the electrode 110 and the electrode 116. It is possible to configure the photoelectric converter PD1 with use of the photoelectric conversion film 112, the electrode 110, and the electrode 116. The photoelectric converter PD1 includes the photoelectric conversion film 112, and the electrodes 110 and 116 that is disposed with the photoelectric conversion film 112 interposed therebetween. The photoelectric converter PD1 has a configuration in which the electrode 110, the photoelectric conversion film 112, and the electrode 116 are stacked in this order from side of the semiconductor substrate 300. The photoelectric converter PD1 (the photoelectric conversion film 112) absorbs, for example, blue light (e.g., light having a wavelength of 425 nm to 495 nm) to generate electric charges (photoelectric conversion). That is, each of the pixels 100 includes a stacked-typed photoelectric converter in which three photoelectric converters PD1, PD2, and PD3 having wavelength selectivities different from each other are stacked. The solid-state imaging device 1 includes the stacked-type photoelectric converter described above for each pixel 100. The electrodes 110 and 116 are formed using a material similar to that of the electrodes 210 and 216 (transparent electrically conductive films).

The photoelectric converter PD1 corresponds to a specific example of a "photoelectric converter" or a "first photoelectric converter" of the present disclosure. The electrode 110 corresponds to a specific example of a "first electrode" or a "first upper electrode" of the present disclosure. The electrode 116 corresponds to a specific example of a "second electrode" or a "counter electrode" of the present disclosure. The photoelectric conversion film 112 corresponds to a specific example of a "photoelectric conversion film" or a "first photoelectric conversion film" of the present disclosure.

As illustrated in FIGS. 3 and 4, the photoelectric converter PD1 includes a storage electrode 114 (114_a_ and 114_b_), which is opposed to the electrode 110 with the photoelectric conversion film 112 interposed therebetween, to temporality store electric charges generated by the photoelectric conversion film 112 in the photoelectric conversion film 112. Specifically, the storage electrode 114 is in contact with the photoelectric conversion film 212 with an insulating film 118 interposed therebetween or with the insulating film 118 and an unillustrated semiconductor layer interposed therebetween. Examples of a material of the insulating film 118 may include $Al_2O_3$ and the like that allow light to pass therethrough. The storage electrode 114 (114_a_ and 114_b_) corresponds to a specific example of a "storage electrode" or a "first storage electrode" of the present disclosure. The insulating film 118 corresponds to a specific example of an "insulating layer" or a "first insulating layer" of the present disclosure.

The wiring lines 116 and 250, and the like are electrically coupled to the electrode 116 and the storage electrode 114, and a desired potential is applied to the electrode 216 and the storage electrode 214 with use of the wiring lines 116 and 250, and the like. The wiring lines 108 and 106, and the like are electrically coupled to the electrode 110, and a desired potential is applied to the electrode 110 with use of these wiring lines 108 and 106, and the like. Furthermore, the electrode 116 is coupled to the floating diffusion section 322_b_ provided in the semiconductor substrate 300 via the through electrodes 120 and 302. Controlling a potential to be applied to the electrode 110 and the storage electrode 114 makes it possible to store electric charges generated by the photoelectric conversion film 112 in the photoelectric conversion film 112, and take out the electric charges to the floating diffusion section 322_b_ via the electrode 116 and the through electrodes 120 and 302. The storage electrode 114 is able to function as an electric charge storage electrode for attracting electric charges generated by the photoelectric conversion film 112 in accordance with an applied potential and storing the electric charges in the photoelectric conversion film 112. In order to effectively use light incident on the pixel 100, the storage electrode 214 is preferably provided to have a larger area than that of the electrode 116 as viewed from above the light receiving surface.

The photoelectric converter PD1 and the photoelectric converter PD2 that are adjacent to each other in the direction normal to the semiconductor substrate 300 are disposed to cause the electrode 110 of the photoelectric converter PD1 and the electrode 210 of the photoelectric converter PD2 to be opposed to each other. That is, the stacking order of a plurality of layers included in the photoelectric converter PD1, and the stacking order of a plurality of layers that is included in the photoelectric converter PD2 and corresponds to the plurality of layers included in the photoelectric converter PD1 are symmetrical with respect to the junction surface S as a reference. The electrode 116 of the photoelectric converter PD1 and the electrode 216 of the photoelectric converter PD2 are disposed to be opposed to each other in the direction normal to the semiconductor substrate 300. The through electrode 120 is disposed at a position opposed to the electrode 210 in the direction normal to the semiconductor substrate 300.

It is possible to form the photoelectric conversion films 112 and 212 using an organic material (an organic photoelectric conversion film) or an inorganic material (an inorganic photoelectric conversion film). For example, in a case where the photoelectric conversion film is formed using an organic material, it is possible to select one from four modes: (a) a P-type organic semiconductor material, (b) N-type organic semiconductor material, (c) a stack structure of at least two of a P-type organic semiconductor material layer, an N-type organic semiconductor material layer, and a mixed layer (bulk heterostructure) of a P-type organic semiconductor material and an N-type organic semiconductor material, and (d) a mixed layer of a P-type organic semiconductor material and an N-type organic semiconductor material. The photoelectric conversion film using the organic material also includes a stack structure in which an electron blocking film/buffer film a photoelectric conversion film, a hole blocking, film, a hole blocking/buffer film, and a work function adjusting film are stacked, or the like on the electrode.

Specific examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a coumarin derivative, a pyrromethene derivative, a pyran derivative, a phenoxazone derivative, a thiophene derivative, a thienothiophene derivative, a benzothiophene derivative, a benzothienobenzothiophene (BTBT) derivative, a dinaphthothienothiophene (DNTT) derivative, a dianthracenothienothiophene (DATT) derivative, a benzobisbenzothiophene (BBBT) derivative, a naphthalenebisbenzothiophene (NBBT) derivative, a thienobisbenzothiophene (TBBT) derivative, a dibenzothienobisbenzothiophene (DBTBT) derivative, a dithienobenzodithiophene (DTBDT) derivative, a dibenzothienodithiophene (DBTDT) derivative, a benzodithiophene (BDT) derivative, a naphthodithiophene (NDT) derivative, an anthracenodithiophene (ADT) derivative, a tetracenodithiophene (TDT) derivative, a pentacenodithiophene (PDT) derivative, a triallylamine derivative, a carbazole derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, a polyfluorene derivative, and the like.

In addition, examples of the N-type organic semiconductor material include fullerene and a fullerene derivative (e.g., fullerenes such as C60, C70, and C74 (higher fullerene), endohedral fullerenes, and the like), or a fullerene derivative (e.g., a fullerene fluoride, a PCBM (Phenyl-C61-Butyric Acid Methyl Ester) fullerene compound, a fullerene multimer, and the like)), an organic semiconductor having a deeper HOMO (Highest Occupied Molecular Orbital) value and a deeper LUMO (Lowest Unoccupied Molecular Orbital) value than the p-type semiconductor, an inorganic metal oxide that allow light to pass therethrough, and the like. More specific examples of the N-type organic semiconductor material may include a heterocyclic compound including a nitrogen atom, an oxygen atom, a sulfur atom. Examples of the heterocyclic compound include a pyridine derivative, a pyrromethene derivative, a pyrazine derivative, a pyrimidine derivative, a triazine derivative, a quinoline derivative, a quinoxaline derivative, an isoquinoline derivative, a coumarin derivative, a pyran derivative, a phenoxazone derivative, a perylene derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylene vinylene derivative, a polybenzothiadiazole derivative, an organic molecule having a polyfluorene derivative or the like in a portion of a molecular skeleton, an organic metal complex, and a subphthalocyanine derivative.

In addition, examples of a group or the like included in a fullerene derivative may include a branched or cyclic alkyl group or phenyl group, a group having a straight-chain or condensed aromatic compound, a group having a halide, a partial fluoroalkyl group, a perfluoroalkyl group, a silyl alkyl group, a silyl alkoxy group, an aryl silyl group, an aryl sulfanyl group, an alkyl sulfanyl group, an aryl sulfonyl group, an alkyl sulfonyl group, an aryl sulfide group, an alkyl sulfide group, an amino group, an alkyl amino group, an aryl amino group, a hydroxy group, an alkoxy group, an acyl amino group, an acyloxy group, a carbonyl group, a carboxy group, a carboxamide group, a carboalkoxy group, an acyl group, a sulfonyl group, a cyano group, a nitro group, a group having a chalcogenide, a phosphine group, a phosphone group, and derivatives thereof. It is to be noted that a film thickness of the photoelectric conversion film formed using an organic material is not limited, but may be, for example, $1\times10^{-8}$ in to $5\times10^{-7}$ preferably $2.5\times10^{-8}$ m to $3\times10^{-7}$ m, more preferably $2.5\times10^{-8}$ m to $2\times10^{-7}$ m. In addition, in the above description, the organic semiconductor materials are classified into the P-type and the in which the P-type means that holes are easily transported, and the N-type means that electrons are easily transported. That is, in the organic semiconductor materials, the types are not limited to the interpretation of having holes or electrons as majority carriers for thermal excitation, unlike inorganic semiconductor materials.

In addition, in a case where the photoelectric conversion films 112 and 212 are formed using an inorganic material, examples of inorganic semiconductor materials may include crystalline silicon, amorphous silicon, microcrystalline silicon, crystalline selenium, amorphous selenium, chalcopynte compounds such as CIGS (CuInGaSe), CIS ($CuInSe_2$), $CuInS_2$, $CuAlS_2$, $CuAlSe_2$, $CuGaS_2$, $CuGaSe_2$, $AgAlS_2$, $AgAlSe_2$, $AgInS_2$, and $AgInSe_2$, III-V group compounds such as GaAs, InP, AlGaAs, InGaP, AlGaInP, and InGaAsP, and compound semiconductors such as CdSe, CdS, $In_2Se_3$, $In_2S_3$, $Bi_2Se_3$, $Bi_2S_3$, ZnSe, ZnS, PbSe. and PbS. In addition, in the present embodiment, it is possible to use quantum dots including these materials described above as the photoelectric conversion films 112 and 212.

The photoelectric conversion films 112 and 212 may be formed using a polymer such as phenylene vinylene, fluorene, carbazole, indole, pyrene, pyrrole, picoline, thiophene, acetylene, and diacetylene, or a derivative thereof.

In order to detect blue light and green light, in the photoelectric conversion films 112 and 212, for example, it is possible to preferably use a metal complex dye, a rhodamine-based dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthaquinone, an anthraquinone-based dye, a chain compound in which a condensed polycyclic aromatic group such as anthracene and pyrene and an aromatic ring or a heterocyclic compound are condensed, a cyanine-like dye bonded by two nitrogen-containing hetero rings such as quinoline, benzothiazole, and benzoxazole that have a squarylium group and a croconic methine group as a bonded chain, or by a squarylium group or a croconic methine group, or the like. In addition, as the metal complex dye described above, a dithiol metal complex-based dye, a metallophthalocyanine dye, a metalloporphyrine dye, or a ruthenium complex dye is preferable, and the ruthenium complex dye is particularly preferable, but the metal complex dye is not limited thereto.

In a case where the photoelectric conversion films 112 and 212 are caused to function as photoelectric conversion films that detect red light, it is possible for the photoelectric conversion films to include a phthalocyanine-based dye, a subphthalocyanine-based dye (a subphthalocyanine derivative), or the like.

As illustrated in FIGS. 3 and 4, for example, similarly to the sealing film 204, a sealing film 104 including SiN or the like is provided above the photoelectric converter PD1. Examples of a material of the sealing film 104 may include $Al_2O_3$ and the like that allow light to pass therethrough. As the material of the sealing film 104, in addition to $Al_2O_3$, it is possible to use $SiO_2$, $Si_3N_4$, SiON, SiC, SiCO, or the like, and the material of the sealing film 104 is not particularly limited. Furthermore, as illustrated in FIGS. 3 and 4, a high refractive index layer (not illustrated) including an inorganic film such as a silicon nitride film, a silicon oxynitride film, or silicon carbide (SiC) is provided on the sealing film 104. Furthermore, an on-chip lens 102 (102*a* and 102*b*) is provided for each pixel 100 on the high refractive index layer. It is possible to form the on-chip lens 102 with use of, for example, a silicon nitride film or a resin-based material such as a styrene-based resin, an acrylic-based resin, a styrene-acrylic copolymer-based resin, or a siloxane-based resin.

As described above, the pixel 100 has a stack structure in which PD1, PD2, and PD3 that detect light of three colors are stacked. That is, it can be said that the pixel 100 is a longitudinal spectral type solid-state imaging element that performs photoelectric conversion of blue light by the photoelectric conversion film 112 (the photoelectric converter PD1) formed above the semiconductor substrate 300, performs photoelectric conversion of green light by the photoelectric conversion film 212 (the photoelectric converter PD2) provided below the photoelectric converter PD1, and performs photoelectric conversion of red light by the photoelectric converter PD3 provided in the semiconductor substrate 300.

The pixel 100 is not limited to a longitudinal spectral type stack structure described above. For example, green light may be photoelectrically converted by the photoelectric conversion film 112 (the photoelectric converter PD1) formed above the semiconductor substrate 300, and blue light may be photoelectrically converted by the photoelectric conversion film 212 (the photoelectric converter PD2) provided below the photoelectric converter PD1. In addition, the pixel 100 may further include a photoelectric conversion film that detects infrared rays. Furthermore, the pixel 100 may have a structure in which the photoelectric converter PD1 including the photoelectric conversion film 112 provided above the semiconductor substrate 300, and the photoelectric converters PD2 and PD3 provided in the semiconductor substrate 300 are stacked. That is, the pixel 100 may have a structure in which the two photoelectric converters PD2 and PD3 are stacked in the semiconductor substrate 300.

(Photoelectric Converter and Pixel Circuit)

Next, description is given of cross-sectional configurations of the photoelectric converters PD1, PD2, and PD3 included in the pixel 100 and circuit configurations of the pixel circuits coupled to them with reference to FIGS. 5 and 6. FIG. 5 illustrates a cross-sectional configuration example of the photoelectric converter PD1 and a circuit configuration example of the pixel circuit coupled to the photoelectric converter PD1. It is to be noted that the photoelectric converter PD2 has a cross-sectional configuration similar to that of the photoelectric converter PD1. The pixel circuit coupled to the photoelectric converter PD2 has a circuit configuration similar to that of the pixel circuit coupled to the photoelectric converter PD1. FIG. 6 illustrates a cross-sectional configuration example of the photoelectric converter PD3 and a circuit configuration example of the pixel circuit coupled to the photoelectric converter PD3.

The photoelectric converter PD1 includes the electrode 110, the electrode 116, and the photoelectric conversion film 112 sandwiched between the electrode 110 and the electrode 116. The photoelectric converter PD1 includes storage electrodes 114*a* and 114*b* that are in contact with the photoelectric conversion film 112 with the insulating film 118 interposed therebetween. As illustrated in FIG. 5, the storage electrodes 114*a* and 114*b* are disposed to be line-symmetrical with the electrode 116 interposed therebetween in a case where the pixel 100 is viewed from above the light receiving surface.

The electrode 116 is electrically coupled to the pixel circuit (an amplification transistor $TR_{amp}$, a selection transistor $TR_{sel}$, and a reset transistor $TR_{rst}$) through a wiring line. Specifically, the electrode 116 is electrically coupled to one of drain/sources of the reset transistor $TR_{rst}$ for resetting stored electric charges via a wiring line or the like. A gate of the reset transistor $TR_{rst}$ is electrically coupled to a reset signal line, and is further electrically coupled to the vertical drive circuit section 32. The other (on side not coupled to the electrode 116) of the drain/sources of the reset transistor $TR_{rst}$ is electrically coupled to a power supply circuit VDD.

The electrode 116 is electrically coupled, via a wiring line, to a gate of the amplification transistor $TR_{amp}$ that amplifies (converts) electric charges and outputs the amplified electric charges as pixel signals. One of source/drains of the amplification transistor $TR_{amp}$ is electrically coupled, via a wiring line, to one of source/drains of the selection transistor $TR_{sel}$ that outputs the pixel signal to the vertical signal line 44 in accordance with a selection signal. The other (on side not coupled to the selection transistor $TR_{sel}$) of the source/drains of the amplification transistor $TR_{amp}$ is electrically coupled to the power supply circuit VDD.

The other (on side not coupled to the amplification transistor $TR_{amp}$) of the source/drains of the selection transistor $TR_{sel}$ is electrically coupled to the vertical signal line 44, and is further electrically coupled to the column signal processing circuit section 34. In addition, a gate of the selection transistor $TR_{sel}$ is electrically coupled to the pixel drive line 42, and is further electrically coupled to the vertical drive circuit section 32. The storage electrodes 114*a* and 114*b* are electrically coupled to the vertical drive circuit section 32 via a wiring line.

Next, description is given of the cross-sectional configuration of the photoelectric converter PD3 and the pixel circuit coupled to the photoelectric converter PD. The photoelectric converter PD3 is coupled to the pixel circuit (the amplification transistor $TR_{amp}$, a transfer transistor $TR_{trs}$, the reset transistor $TR_{rst}$, and the selection transistor $TR_{sel}$) provided in the semiconductor substrate 300 via a wiring line, as illustrated in FIG. 6. Specifically, one side of the photoelectric converter PD3 is electrically coupled, via a wiring line, to one of source/drains of the transfer transistor $TR_{trs}$ that transfers electric charges. The other (on side not coupled to the photoelectric converter PD3) of the source/drains of the transfer transistor $TR_{trs}$ is electrically coupled to one of the source/drains of the reset transistor $TR_{rst}$ via a wiring line. A gate of the transfer transistor $TR_{trs}$ is electrically coupled to the pixel drive line 42, and is further coupled to the vertical drive circuit section 32. The other (on side not coupled to the transfer transistor $TR_{trs}$) of the source/drains of the reset transistor $TR_{rst}$ is electrically coupled to the power supply circuit VDD. The gate of the reset transistor $TR_{rst}$ is electrically coupled to the pixel drive line 42, and is further coupled to the vertical drive circuit section 32.

The other (on side not coupled to the photoelectric converter PD3) of the source/drains of the transfer transistor $TR_{trs}$ is also electrically coupled, via a wiring line, to the gate of the amplification transistor $TR_{amp}$ that amplifies (converts) electric charges and outputs the amplified electric charges as pixel signals. One of the source/drains of the amplification transistor $TR_{amp}$ is electrically coupled, via a wiring line, to one of the source/drains of the selection transistor $TR_{sel}$ that outputs the pixel signal to the vertical signal line 44 in accordance with a selection signal. Then, the other (on side not coupled to the selection transistor $TR_{sel}$) of the source/drains of the amplification transistor $TR_{amp}$ is electrically coupled to the power supply circuit VDD. The other (on side not coupled to the amplification transistor $TR_{amp}$) of the source/drains of the selection transistor $TR_{sel}$ is electrically coupled to the pixel drive line 42, and is further electrically coupled to the column signal processing circuit section 34. Then, the gate of the selection transistor $TR_{sel}$ is electrically coupled to the pixel drive line 42, and is further electrically coupled to the vertical drive circuit section 32.

[Manufacturing Method]

Next, description is given of a method of manufacturing the solid-state imaging device 1 with reference to FIGS. 7 to 15. FIGS. 7 to 15 are diagrams for describing the method of manufacturing the solid-state imaging device 1.

First, a SOI substrate, a support substrate, or the like is used to prepare a semiconductor substrate 400 in which the photoelectric converters PD1 and PD2, and pixel circuits, wiring lines, and through electrodes, and the like that correspond to the photoelectric converters PD1 and PD2 are formed. The semiconductor substrate 400 is a substrate including the electrode 216, the photoelectric conversion film 212, and the electrode 210 on the semiconductor substrate 300 in this order from side of the semiconductor substrate 300. The semiconductor substrate 400 corresponds to a specific example of a "second substrate" of the present disclosure. The semiconductor substrate 300 corresponds to a specific example of a "first semiconductor substrate" of the present disclosure. The sealing film 204 that seals the electrode 210 is formed on a front surface of the semiconductor substrate 400. Thus, the semiconductor substrate 400 illustrated on lower side of FIG. 7 is obtained.

In addition, a SOI substrate, a support substrate, or the like is used to prepare a semiconductor substrate 500 in which a portion (the electrode 110 and the photoelectric conversion film 112) of the photoelectric converter PD1, wiring lines, and the like are formed. The semiconductor substrate 500 is a substrate including the photoelectric conversion film 112 and the electrode 110 on a semiconductor substrate 150 in this order from side of the semiconductor substrate 150. The semiconductor substrate 500 corresponds to a specific example of a "first substrate" of the present disclosure. The semiconductor substrate 150 is, for example, a SOI substrate, a support substrate, or the like, and corresponds to a specific example of a "first semiconductor substrate" of the present disclosure. The sealing film 119 that seals the electrode 110 is formed on a front surface of the semiconductor substrate 500. Thus, the semiconductor substrate 500 illustrated on upper side of FIG. 7 is obtained.

Next, the semiconductor substrates 400 and 500 are placed in a chamber CM of a plasma CVD apparatus. The plasma CVD apparatus is, for example, a parallel plate plasma generator in which electrodes E1 and E2 are disposed to be opposed to each other with a predetermined gap interposed therebetween, as illustrated in (A) of FIG. 8. At this time, the semiconductor substrate 500 is disposed on the electrode E1 coupled to an alternating-current source PW to cause the electrode 110 to be opposed to the electrode E2. Furthermore, the semiconductor substrate 400 is disposed on the electrode E2 coupled to a ground to cause the electrode 210 to be opposed to the electrode E1.

After the chamber CM is evacuated, predetermined junction processing is performed on the front surfaces of the semiconductor substrates 400 and 500. For example, as illustrated in (B) of FIG. 8, a predetermined gas GS (e.g., $C_2H_2$) is supplied into the chamber CM while alternating-current power is applied between the electrodes E1 and E2, thereby generating plasma in the chamber CM to form carbon films 205*a* and 205*b* on the front surfaces of the semiconductor substrates 400 and 500. At this time, the carbon films 205*a* and 205*b* are generated by low-temperature plasma; therefore, it is not necessary to heat the semiconductor substrates 400 and 500 to a high temperature, and it is sufficient if the semiconductor substrates 400 and 500 are warmed at, for example, a low temperature of about 150° C. or less. Dangling bonds are formed on front surfaces of the carbon films 205*a* and 205*b* immediately after the carbon films 205*a* and 205*b* are formed.

After supply of the gas GS into the chamber CM and supply of electric power to the electrodes E1 and E2 are stopped, for example, as illustrated in (C) of FIG. 8, the semiconductor substrates 400 and 500 are bonded to each other under vacuum to cause the electrodes 110 and 210 to be opposed to each other. At this time, the carbon films 205*a* and 205*b* are bonded to each other to thereby bond the semiconductor substrates 400 and 500 to each other. At this time, the dangling bonds are formed on the front surfaces of the carbon films 205*a* and 205*b*, which makes it possible to perform bonding called so-called ambient temperature bonding. The carbon film 205 in which the carbon films 205*a* and 205*b* are stacked is present on the junction surfaces S of the semiconductor substrates 400 and 500 bonded to each other. FIG. 10 exemplifies cross-sectional configurations of the semiconductor substrates 400 and 500 bonded together as described above.

It is to be noted that the semiconductor substrates 400 and 500 may be bonded together outside the chamber CM. In this case, for example, as illustrated in (A) of FIG. 9, the carbon film 205*a* is formed on the front surface of the semiconductor substrate 500, and as illustrated in (B) of FIG. 9, the carbon film 205*b* is formed on the front surface of the semiconductor substrate 400. Thereafter, for example, as illustrated in (C) of FIG. 9, the semiconductor substrates 400 and 500 are bonded together outside the chamber CM.

In addition, upon bonding the semiconductor substrates 400 and 500 to each other, it is sufficient if a carbon film is formed on the front surface of one of the semiconductor substrates 400 and 500. Accordingly, for example, as illustrated in (A) of FIG. 9, after the carbon film 205*a* is formed only on the front surface of the semiconductor substrate 500, the semiconductor substrate 500 on which the carbon film 205*a* is formed, and the semiconductor substrate 400 on which the carbon film 205*b* is not formed may be bonded to each other. In addition, for example, as illustrated in (B) of FIG. 9, after the carbon film 205*b* is formed only on the front surface of the semiconductor substrate 400, the semiconductor substrate 500 on which the carbon film 205*a* is not formed, and the semiconductor substrate 400 on which the carbon film 205*b* is formed may be bonded to each other. In these cases, the carbon film 205*a* or the carbon film 205*b* is present as the carbon film 205 on the junction surfaces S of the semiconductor substrates 400 and 500 that are bonded to each other.

After bonding of the semiconductor substrates 400 and 500 is completed, the semiconductor substrate 150 is removed to expose an insulating film 118*a* and a portion of the photoelectric conversion film 112 (FIG. 11). The semiconductor substrate 150 is, for example, a SOI substrate, a support substrate, or the like. The insulating film 118*a* corresponds to a portion of the insulating film 118. Next, the storage electrode 114 is formed in a region where the insulating film 118*a* is exposed, the electrode 116 is formed to cover a region where the photoelectric conversion film 112 is exposed, and an insulating film 118*b* is formed in a region where the storage electrode 114 and the electrode 116 are not formed (FIG. 12). Thus, the insulating film 118 including the insulating films 118*a* and 118*b* is formed.

Next, a groove section H that reaches the electrode 216 from the electrode 116 is formed (FIG. 13). This causes a portion of the electrode 216 to be exposed on a bottom surface of the groove section H. Next, after the insulating film 117 is formed on a side surface of the groove section H with use of, for example, CVD, the groove section H is filled with an electrically conductive material to form the through electrode 120 and the electrode 116 (FIGS. 14 and 15). This makes it possible to form the electrode 116 and the through electrode 120 that is electrically coupled to the electrode 216. Thereafter, the wiring line 108 that is in contact with the electrodes 110 and 210, and the wiring line 106 that is in contact with the wiring line 108 are formed, and the sealing film 104 that seals the wiring lines 114, 116, and 106 is formed. Finally, the on-chip lens 102 is formed on the sealing film 104. Thus, the solid-state imaging device 1 is manufactured.

[Effects]

Next, description is given of effects of the solid-state imaging device 1.

In recent years, in CCD image sensors and CMOS image sensors, an amount of light incident on a unit pixel is reduced with a reduction in a pixel size. For this reason, sensitivity is lowered and a S/N (signal/noise) ratio is lowered. In addition, in various image sensors described above, a configuration in which pixels that detect red light, green light, and blue light with use of primary color filters are arranged on a plane (e.g., a Bayer arrangement) is widely used. In a case of such a configuration, for example, in a pixel that detects red light, green light and blue light are difficult to pass through a color filter included in the pixel; therefore, photoelectric conversion of the green light and the blue light is not performed in the pixel, that is, the green light and the blue light are not detected. Accordingly, in a case of a configuration as described above, in each pixel, light of one specific color is detected and light of the other colors is not detectable. For this reason, it cannot be said that light incident on each pixel is sufficiently used. In other words, it can be said that a loss occurs in terms of pixel sensitivity.

A method of solving a situation as described above may be an image sensor in which three layers of photoelectric conversion films that are able to perform photoelectric conversion by red light, green light, and blue light are stacked in a longitudinal direction in a unit pixel to allow for detection of light of three colors by one unit pixel. In addition, another image sensor that allows for detection of light of three colors by one unit pixel may be an image sensor including a silicon substrate on which two photodiodes (PDs) that respectively detect red light and blue light are stacked, and a photoelectric conversion film that is provided above the silicon substrate and is able to perform photoelectric conversion by green light.

Furthermore, a specific circuit configuration for taking out a pixel signal in the image sensor including the silicon substrate on which the two PDs are stacked and the photoelectric conversion film provided above the silicon substrate is as follows. For example, a back-illuminated type structure may be adopted in which a circuit formation layer in which the circuit described above is formed is formed on side opposite to a light receiving surface (on light incident side) of the image sensor. In addition, a structure may be adopted in which a semiconductor layer for storing and transferring electric charges obtained by photoelectric conversion, and a storage electrode that is opposed to the semiconductor layer described above with an insulating film interposed therebetween are provided immediately below a photoelectric conversion film provided above a silicon substrate.

In a case where an organic photoelectric conversion layer is formed in the back-illuminated type, a circuit, a wiring line, and the like are not formed between an inorganic photoelectric converter and an organic photoelectric converter, which makes it possible to shorten a distance between the inorganic photoelectric converter and the organic photoelectric converter in the same pixel. As a result, it is possible to suppress F-number dependence of each color and suppress variations in sensitivity between the respective colors. In addition, in a case where an electric charge storage electrode is provided to be opposed to a photoelectric conversion layer with an insulating layer interposed therebetween, when a photoelectric converter is irradiated with light and the light is photoelectrically converted by the photoelectric converter, it is possible to store electric charges of the photoelectric conversion layer. Accordingly, at the start of exposure, it is possible to completely deplete an electric charge storage section and erase electric charges. As a result, it is possible to suppress occurrence of a phenomenon in which kTC noise is increased and random noise is deteriorated, thereby leading to deterioration in image quality in imaging.

Incidentally, in the solid-state imaging device described above, in a case where a plurality of photoelectric converters having wavelength selectivities different from each other is provided for each pixel, in order to obtain, as pixel signals, electric charges generated by the respective photoelectric converters, it is necessary to provide a wiring line coupled to each of the photoelectric converters. The wiring line is one of essential elements for efficient output and transfer of the pixel signals. However, in existing proposals, preferred configurations and positions of a pixel transistor and a wiring line has not been specifically studied. In addition, even in a case where the configuration and the position of the pixel transistor have been disclosed, such a disclosure provides an effective configuration and an effective position that allow for efficient output and transfer of pixel signals, and it is difficult to say that it is possible to suppress an increase in manufacturing cost.

In contrast, in the present embodiment, the through electrode 120 is formed that is in contact with the electrodes 116 and 216 of the plurality of photoelectric converters PD1 and PD2 stacked on the semiconductor substrate 300. Accordingly, electric charges generated by each of the photoelectric converters PD1 and PD2 are obtained via the common through electrode 120, which makes it possible to simplify a wiring layout and shorten a wiring distance, as compared with a case where electric charges generated by each of the photoelectric converters PD1 and PD2 are obtained via a wiring line provided for each of the photoelectric converters PD1 and PD2 or via a wiring line routed in an in-plane direction of a stacking surface. Thus, it is possible to efficiently output and transfer the pixel signals.

In the present embodiment, the through electrode 120 is formed at a position opposed to the electrode 216 in the direction normal to the semiconductor substrate 300. This makes it possible to simplify the wiring layout and shorten the wiring distance, as compared with the case where electric charges generated by each of the photoelectric converters PD1 and PD2 are obtained via the wiring line provided for each of the photoelectric converters PD1 and PD2 or via the wiring line routed in the in-plane direction of the stacking surface. Thus, it is possible to efficiently output and transfer the pixel signals.

In the present embodiment, the through electrode 302 coupled to the through electrode 120 is formed to extend to a layer where the pixel circuit is formed. This makes it possible to simplify the wiring layout and shorten the wiring distance, as compared with the case where electric charges generated by each of the photoelectric converters PD1 and PD2 are obtained via the wiring line provided for each of the photoelectric converters PD1 and PD2 or via the wiring line routed in the in-plane direction of the stacking surface. Thus, it is possible to efficiently output and transfer the pixel signals.

In the present embodiment, the photoelectric converters PD1 and PD2 adjacent to each other in the direction normal to the semiconductor substrate 300 are disposed to cause the electrodes 110 and 210 to be opposed to each other. In a manufacturing process, the semiconductor substrate 500 including a portion of the photoelectric converter PD1 and the semiconductor substrate 400 including the photoelectric converter PD2 are bonded together to cause the electrodes 110 and 210 to be opposed to each other, thus making it possible to form such a configuration. In a case where such bonding is used, for example, it is possible to form an oxide semiconductor layer and the like that need high-temperature treatment before forming the photoelectric conversion films 112 and 212 that need low-temperature treatment. Thus, it is possible to achieve the solid-state imaging device 1 using the oxide semiconductor layer.

In the present embodiment, the sealing film 204 that seals the electrode 210 and the sealing film 119 that seals the electrode 110 have the junction surfaces S joined to each other by predetermined junction processing. In a manufacturing process, the semiconductor substrate 500 on which the sealing film 119 is formed and the semiconductor substrate 400 on which the sealing film 204 is formed are bonded to each other by bonding the sealing films 119 and 204, thus making it possible to form such a configuration. Here, in a case where the sealing films 119 and 204 each include an inorganic oxide film, an inorganic nitride film, or an inorganic oxynitride film, a carbon film (205*a* and 205*b*) is formed on the front surface of at least one of the sealing film 119 or the sealing film 204, and carbon films (205*a* and 205*b*) are bonded to each other, which makes it possible to bond the semiconductor substrates 400 and 500 to each other.

In the present embodiment, the through electrode 120 is configured to include a columnar electrically conductive member that penetrates through the same plane as the junction surfaces S and has not been subjected to junction processing. In a manufacturing process, a groove section is formed on the semiconductor substrates 400 and 500 bonded together, and the columnar electrically conductive member is embedded in the formed groove section, thus making it possible to form such a configuration. This makes it possible to form the through electrode 120 smaller, as compared with, for example, a case where a pad electrode is formed in each of the semiconductor substrates 400 and 500 and both the pad electrodes are bonded together to provide a through electrode. Thus, it is possible to efficiently output and transfer the pixel signals.

In the present embodiment, the through electrode 120 is formed that is in contact with the electrodes 116 and 216 of the plurality of photoelectric converters PD1 and PD2 stacked on the semiconductor substrate 300. Accordingly, electric charges generated by each of the photoelectric converters PD1 and PD2 are obtained via the common through electrode 120, which makes it possible to simplify the wiring layout and shorten the wiring distance, as compared with the case where electric charges generated by each of the photoelectric converters PD1 and PD2 are obtained via the wiring line provided for each of the photoelectric converters PD1 and PD2 or via the wiring line routed in the in-plane direction of the stacking surface. Thus, it is possible to efficiently output and transfer the pixel signals.

2. Modification Examples

The following description is given of modification examples of the solid-state imaging device 1 according to the embodiment described above and the method of manufacturing the solid-state imaging device 1.

Modification Example A

In the embodiment described above, for example, as illustrated in FIG. 16, the electrode 210 and the electrode 110 may be joined to each other. At this time, the electrode 210 and the electrode 110 are not sealed by the sealing films 204 and 119, and have the junction surfaces S joined to each other by predetermined junction processing. The carbon film 205 that joins the sealing film 204 and the sealing film 119 together is provided on the junction surfaces S.

At this time, in a case where the electrodes 210 and 110 each include a transparent electrically conductive film, after the predetermined junction processing is performed on the front surface of at least one of the electrode 210 or the electrode 110, the semiconductor substrates 400 and 500 may be bonded to each other by bonding the electrodes 210 and 110 to each other. In addition, in a case where the electrodes 210 and 110 each include a transparent electrically conductive film, a carbon film (205*a* and 205*b*) is formed on the front surface of at least one of the electrode 210 or the electrode 110, and the carbon films (205*a* and 205*b*) are bonded to each other, which makes it possible to bond the semiconductor substrates 400 and 500 to each other.

Modification Example B

In the embodiment described above and the modification example thereof, for example, as illustrated in FIGS. 17 and 18, a groove section 104A may be provided in the sealing film 104. The groove section 104A is provided at a position opposed to the on-chip lens 102 in the sealing film 104, and the on-chip lens 102 is bonded to a bottom surface of the groove section 104A. Suh a configuration makes it possible to adjust a distance between the on-chip lens 102 and each of the photoelectric converters PD1, PD2, and PD3 by adjusting a depth of the groove section 104A.

Modification Example C

In the embodiment and the modification examples thereof, for example, as illustrated in FIGS. 19 and 20, an oxide semiconductor layer 140 that allows light to pass therethrough may be provided between the insulating film 218 and the photoelectric conversion film 212. At this time, the storage electrode 214 is disposed to be opposed to the oxide semiconductor layer 140 with the insulating film 218 interposed therebetween. Similarly, for example, as illustrated in FIGS. 19 and 20, an oxide semiconductor layer 142 that allows light to pass therethrough may be provided between the insulating film 118 and the photoelectric conversion film 112. At this time, the storage electrode 114 is disposed to be opposed to the oxide semiconductor layer 142 with the insulating film 118 interposed therebetween. The oxide semiconductor layer 140 is in contact with the photoelectric conversion film 212, and is disposed to be opposed to the electrode 210 with the photoelectric conversion film 212 interposed therebetween. The oxide semiconductor layer 142 is in contact with the photoelectric conversion film 112, and is disposed to be opposed to the electrode 110 with the photoelectric conversion film 112 interposed therebetween.

Examples of materials of the oxide semiconductor layers 140 and 142 include tin oxide-based materials including $SnO_2$ (doped with a dopant) and tin oxide doped with a dopant such as zinc-tin oxide, and zinc oxide-based materials including aluminum-zinc oxide (e.g., AZO), gallium-zinc oxide (e.g., GZO), indium-zinc oxide (e.g., IZO), IGZO, and ITZO, and the like. Examples of materials of the oxide semiconductor layers 140 and 142 may include $InSbO_4$, ZnMgO, $CuInO_2$, $MgIn_2O_4$, CdO, GeO, $TiO_2$, and the like.

Providing the oxide semiconductor layers 140 and 142 in such a manner makes it possible to store electric charges more efficiently.

Modification Example D

In the embodiment described above and the modification examples thereof, for example, as illustrated in FIGS. 21 and 22, the through electrode 120 may include a pair of pad electrodes 120*a* and 120*b* bonded to each other in the same plane as the junction surfaces S. In this case, in a manufacturing process, a columnar electrically conductive member and the pad electrode 120*a* that are provided on side of the photoelectric conversion film 112, and a columnar electrically conductive member and the pad electrode 120*b* that are provided on side of the photoelectric conversion film 212 are bonded to each other by bonding the pad electrodes 120*a* and 120*b*, thus making it possible to form the through electrode 120. In a case where sufficient alignment accuracy is obtained for bonding the pad electrode 120*a* and the pad electrode 120*b* together in a manufacturing process, it is possible to configure the through electrode 120 by such a stacked body.

3. Application Examples

The solid-state imaging device 1 according to any of the embodiment described above and the modification examples thereof is applicable to all types of electronic apparatuses using a solid-state imaging element for an image capturing section, including an imaging device such as a digital still camera or a video camera, a mobile terminal device having an imaging function, and a copying machine using a solid-state imaging element for an image reading section. Furthermore, the embodiment of the present disclosure is applicable to a robot, a drone, an automobile, a medical device (an endoscope), and the like that include the solid-state imaging device 1. It is to be noted that the solid-state imaging device 1 according to any of the embodiment described above and the modification examples thereof may be formed as a single chip, and may be implemented in the form of a module having an imaging function in which an imaging section and a signal processor or an optical system are packaged in one unit. Hereinafter, an example of an electronic apparatus 700 including an imaging device 702 that includes the solid-state imaging device 1 according to any of the embodiment described above and the modification examples thereof is described with reference to FIG. 23. FIG. 23 is an explanatory diagram illustrating an example of the electronic apparatus 700 including the imaging device 702 that includes the solid-state imaging device 1 according to any of the embodiment described above and the modification examples thereof.

As illustrated in FIG. 23, the electronic apparatus 700 includes the imaging device 702, an optical lens 710, a shutter mechanism 712, a drive circuit unit 714, and a signal processing circuit unit 716. The optical lens 710 forms an image of image light (incident light) from a subject on an imaging surface of the imaging device 702. This allows signal electric charges to be stored in the solid-state imaging device 1 of the imaging device 702 for a certain period. The shutter mechanism 712 opens or closes to control a period in which the imaging device 702 is irradiated with light and a period in which the light is blocked. The drive circuit unit 714 supplies a drive signal for controlling a signal transfer operation of the imaging device 702, a shutter operation of the shutter mechanism 712, or the like to the imaging device 702 and the shutter mechanism 712. That is, the imaging device 702 performs signal transfer on the basis of the drive signal (a timing signal) supplied from the drive circuit unit 714. The signal processing circuit unit 716 performs various types of signal processing. For example, the signal processing circuit unit 716 outputs an image signal having been subjected to signal processing to, for example, a storage medium (not illustrated) such as a memory, or outputs the image signal to a display section (not illustrated).

In the present application example, the solid-state imaging device 1 according to any of the embodiment described above and the modification examples thereof is applied to the electronic apparatus 700. This makes it possible to obtain a shot image having high sensitivity, thus making it possible to provide the electronic apparatus 700 having high sensitivity.

4. Practical Application Examples

Practical Application Example 1

The technology (present technology) according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, and a robot.

FIG. 24 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 24, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 24, an audio speaker 12061, a display section 12062, and an instrument panel 12063 are illustrated as the output device. The display section 12062 may, for example, include at least one of an on-board display and a head-up display.

FIG. 25 is a diagram depicting an example of the installation position of the imaging section 12031.

In FIG. 25, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 25 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the mobile body control system to which the technology according to the present disclosure may be applied has been described above. The technology according to the present disclosure is applicable to the imaging section 12031 among the configurations described above. Specifically, the solid-state imaging device 1 according to any of the embodiment described above and the modification examples thereof is applicable to the imaging section 12031. Applying the technology according to the present disclosure to the imaging section 12031 makes it possible to obtain a shot image having high sensitivity, thus making it possible to perform highly accurate control with use of the shot image in the mobile body control system.

Practical Application Example 2

FIG. 26 is a view depicting an example of a schematic configuration of an endoscopic surgery system to which the technology according to an embodiment of the present disclosure (present technology) can be applied.

In FIG. 26, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 27 is a block diagram depicting an example of a functional configuration of the camera head 11102 and the CCU 11201 depicted in FIG. 26.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure may be applied has been described above. The technology according to the present disclosure is applicable to the image pickup unit 11402 provided in the camera head 11102 of the endoscope 11100 among the configurations described above. Applying the technology according to the present disclosure to the image pickup unit 11402 makes it possible to obtain a shot image having high sensitivity, thus making it possible to provide the endoscope 11100 having high definition.

The present disclosure has been described above with reference to the embodiment and the modification examples thereof, the application examples, and the practical application examples, but the present disclosure is not limited to the embodiment and the like described above, and may be modified in a variety of ways. It is to be noted that the effects described herein are merely illustrative. The effects of the present disclosure are not limited to the effects described herein. The present disclosure may have effects other than the effects described herein.

In addition, the present disclosure may have the following configurations.

(1)

A solid-state imaging device including:

a plurality of photoelectric converters that is stacked on a semiconductor substrate, and has wavelength selectivities different from each other; and a wiring line that is formed on the semiconductor substrate, and is electrically coupled to the plurality of photoelectric converters, wherein each of the photoelectric converters includes a photoelectric conversion film, and a first electrode and a second electrode that are disposed with the photoelectric conversion film interposed therebetween, and the wiring line extends in a direction normal to the semiconductor substrate, and includes a vertical wiring line formed in contact with the second electrode of each of the photoelectric converters.

(2)

The solid-state imaging device according to (1), in which the second electrodes of the respective photoelectric converters are disposed to be opposed to each other in the direction normal to the semiconductor substrate, and the vertical wiring line is disposed at a position opposed to the second electrodes in the direction normal to the semiconductor substrate.

(3)

The solid-state imaging device according to (1) or (2), further including a pixel circuit that is formed on the semiconductor substrate, and generates and outputs pixel signals based on electric charges outputted from the plurality of photoelectric converters, in which the vertical wiring line is formed to extend to a layer where the pixel circuit is formed.

(4)

The solid-state imaging device according to any one of (1) to (3), in which, of the plurality of photoelectric converters, a first photoelectric converter and a second photoelectric converter that are adjacent to each other in the direction normal to the semiconductor substrate are disposed to cause the first electrodes of the first photoelectric converter and the second photoelectric converter to be opposed to each other.

(5)

The solid-state imaging device according to (4), further including a first sealing film that is in contact with the first electrode of the first photoelectric converter, and a second sealing film that is in contact with the first electrode of the second photoelectric converter, in which the first sealing film and the second sealing film have junction surfaces joined to each other by predetermined junction processing.

(6)

The solid-state imaging device according to (5), in which the vertical wiring line is configured to include a columnar electrically conductive member that penetrates through a same plane as the junction surfaces, and has not been subjected to the junction processing.

(7)

The solid-state imaging device according to (5) or (6), in which the solid-state imaging device further includes a carbon film on the junction surfaces, the carbon film bonding the first sealing film and the second sealing film together.

(8)

The solid-state imaging device according to any one of (5) to (7), in which the first sealing film and the second sealing film each include an inorganic oxide film, an inorganic nitride film, or an inorganic oxynitride film.

(9)

The solid-state imaging device according to (4), in which the first electrode of the first photoelectric converter and the first electrode of the second photoelectric converter have junction surfaces joined to each other by predetermined junction processing.

(10)

The solid-state imaging device according to (9), in which the vertical wiring line is configured to include a columnar electrically conductive member that penetrates through a same plane as the junction surfaces, and has not been subjected to the junction processing.

(11)

The solid-state imaging device according to (9) or (10), in which the solid-state imaging device further includes a carbon film on the junction surfaces, the carbon film bonding the first electrode of the first photoelectric converter and the first electrode of the second photoelectric converter together.

(12)

The solid-state imaging device according to any one of (9) to (11), in which the first electrodes each include a transparent electrically conductive film.

(13)

The solid-state imaging device according to any one of (1) to (12), in which the photoelectric conversion film includes an organic photoelectric conversion film or an inorganic photoelectric conversion film.

(14)

The solid-state imaging device according to any one of (1) to (13), in which each of the photoelectric converters includes an oxide semiconductor layer that is in contact with the photoelectric conversion film, and is disposed to be opposed to the first electrode with the photoelectric conversion film interposed therebetween, and a storage electrode that is disposed to be opposed to the oxide semiconductor layer with an insulating layer interposed therebetween.

(15)

A method of manufacturing a solid-state imaging device including:

bonding a first substrate, which includes a first lower electrode, a first photoelectric conversion film, and a first upper electrode on a first semiconductor substrate in this order from side of the first semiconductor substrate, and a second substrate, which includes a second photoelectric conversion film and a second upper electrode on a second semiconductor substrate in this order from side of the second semiconductor substrate, to each other to cause the first upper electrode and the second upper electrode to be opposed to each other; and after removing the second substrate, forming a counter electrode that is opposed to the second upper electrode with the second photoelectric conversion film interposed therebetween, and forming a vertical wiring line that is electrically coupled to the first lower electrode and the counter electrode by forming a groove section that reaches the first lower electrode from the counter electrode and filling the groove section with an electrically conductive material.

(16)

The method of manufacturing the solid-state imaging device according to (15), in which the first substrate includes a first sealing film that seals the first upper electrode, the second substrate includes a second sealing film that seals the second upper electrode, the method of manufacturing the solid-state imaging device includes performing predetermined junction processing on a front surface of at least one of the first sealing film or the second sealing film, and thereafter bonding the first sealing film and the second sealing film to each other to thereby bond the first substrate and the second substrate to each other.

(17)

The method of manufacturing the solid-state imaging device according to (16), including:

as the predetermined junction processing, performing a process of forming a carbon film on a front surface of at least one of the first sealing film or the second sealing film, and thereafter bonding the first sealing film and the second sealing film to each other with the carbon film interposed therebetween to thereby bond the first substrate and the second substrate to each other.

(18)

The method of manufacturing the solid-state imaging device according to (15), including performing predetermined junction processing on a front surface of at least one of the first upper electrode or the second upper electrode, and thereafter bonding the first upper electrode and the second upper electrode to each other to thereby bond the first substrate and the second substrate to each other.

(19)

The method of manufacturing the solid-state imaging device according to (18), including:

as the predetermined junction processing, performing a process of forming a carbon film on a front surface of at least one of the first upper electrode or the second upper electrode, and thereafter bonding the first upper electrode and the second upper electrode to each other with the carbon film interposed therebetween to thereby bond the first substrate and the second substrate to each other.

(20)

The method of manufacturing the solid-state imaging device according to any one of (15) to (19), in which the first photoelectric converter includes a first oxide semiconductor layer that is in contact with the first photoelectric conversion film, and is disposed to be opposed to the first upper electrode with the first photoelectric conversion film interposed therebetween, and a first storage electrode that is disposed to be opposed to the first oxide semiconductor layer with a first insulating layer interposed therebetween, and the second photoelectric converter includes a second oxide semiconductor layer that is in contact with the second photoelectric conversion film, and is disposed to be opposed to the second upper electrode with the second photoelectric conversion film interposed therebetween, and a second storage electrode that is disposed to be opposed to the second oxide semiconductor layer with a second insulating layer interposed therebetween.

According to a solid-state imaging device according to an embodiment of the present disclosure, a vertical wiring line is formed that is in contact with respective second electrodes of a plurality of photoelectric converters stacked on a semiconductor substrate, which makes it possible to efficiently output and transfer a pixel signal.

According to a method of manufacturing a solid-state imaging device according to an embodiment of the present disclosure, a first substrate and a second substrate are bonded to each other to stack a first lower electrode and a counter electrode, and a vertical wiring line is formed to be in contact with the first lower electrode and the counter electrode that are stacked, which makes it possible to efficiently output and transfer a pixel signal.

This application claims the benefit of Japanese Priority Patent Application JP2019-209438 filed with the Japan Patent Office on Nov. 20, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state imaging device comprising:

a plurality of photoelectric converters that is stacked on a semiconductor substrate, and has wavelength selectivities different from each other; and a wiring line that is formed on the semiconductor substrate, and is electrically coupled to the plurality of photoelectric converters, wherein each of the photoelectric converters includes a photoelectric conversion film, and a first electrode and a second electrode that are disposed with the photoelectric conversion film interposed therebetween, the wiring line extends in a direction normal to the semiconductor substrate, and includes a vertical wiring line formed in contact with the second electrode of each of the photoelectric converters, a first sealing film is in contact with the first electrode of a first photoelectric converter, and a second sealing film is in contact with the first electrode of a second photoelectric converter, and the first sealing film and the second sealing film have junction surfaces, which are surfaces of the first sealing film and the second sealing film that face each other, joined to each other by predetermined junction processing between the first and second sealing films, and at least the first photoelectric converter and the second photoelectric converter have a layer order which is line-symmetric across the junction surfaces.

2. The solid-state imaging device according to claim 1, wherein the second electrodes of the respective photoelectric converters are disposed to be opposed to each other in the direction normal to the semiconductor substrate, and the vertical wiring line is disposed at a position opposed to the second electrodes in the direction normal to the semiconductor substrate.

3. The solid-state imaging device according to claim 2, further comprising a pixel circuit that is formed on the semiconductor substrate, and generates and outputs pixel signals based on electric charges outputted from the plurality of photoelectric converters, wherein the vertical wiring line is formed to extend to a layer where the pixel circuit is formed.

4. The solid-state imaging device according to claim 1, wherein, of the plurality of photoelectric converters, the first photoelectric converter and the second photoelectric converter that are adjacent to each other in the direction normal to the semiconductor substrate are disposed to cause the first electrodes of the first photoelectric converter and the second photoelectric converter to be opposed to each other.

5. The solid-state imaging device according to claim 1, wherein the vertical wiring line is configured to include a columnar electrically conductive member that penetrates through a same plane as the junction surfaces, and has not been subjected to the junction processing.

6. The solid-state imaging device according to claim 1, wherein the solid-state imaging device further includes a carbon film on the junction surfaces, the carbon film bonding the first sealing film and the second sealing film together.

7. The solid-state imaging device according to claim 1, wherein the first sealing film and the second sealing film each include an inorganic oxide film, an inorganic nitride film, or an inorganic oxynitride film.

8. The solid-state imaging device according to claim 4, wherein the first electrode of the first photoelectric converter and the first electrode of the second photoelectric converter have junction surfaces joined to each other by predetermined junction processing.

9. The solid-state imaging device according to claim 8, wherein the vertical wiring line is configured to include a columnar electrically conductive member that penetrates through a same plane as the junction surfaces, and has not been subjected to the junction processing.

10. The solid-state imaging device according to claim 8, wherein the solid-state imaging device further includes a carbon film on the junction surfaces, the carbon film bonding the first electrode of the first photoelectric converter and the first electrode of the second photoelectric converter together.

11. The solid-state imaging device according to claim 8, wherein the first electrodes each include a transparent electrically conductive film.

12. The solid-state imaging device according to claim 1, wherein the photoelectric conversion film comprises an organic photoelectric conversion film or an inorganic photoelectric conversion film.

13. The solid-state imaging device according to claim 1, wherein each of the photoelectric converters includes an oxide semiconductor layer that is in contact with the photoelectric conversion film, and is disposed to be opposed to the first electrode with the photoelectric conversion film interposed therebetween, and a storage electrode that is disposed to be opposed to the oxide semiconductor layer with an insulating layer interposed therebetween.

* * * * *